United States Patent
Glendenning et al.

(10) Patent No.: US 9,146,714 B2
(45) Date of Patent: *Sep. 29, 2015

(54) METHOD AND APPARATUS FOR COMPILING REGULAR EXPRESSIONS

(71) Applicant: Micron Technology, Inc., Boise, ID (US)

(72) Inventors: Paul Glendenning, Woodside, CA (US); Junjuan Xu, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 14/252,542

(22) Filed: Apr. 14, 2014

(65) Prior Publication Data

US 2014/0229925 A1   Aug. 14, 2014

Related U.S. Application Data

(63) Continuation of application No. 13/357,472, filed on Jan. 24, 2012, now Pat. No. 8,726,253.

(60) Provisional application No. 61/436,013, filed on Jan. 25, 2011.

(51) Int. Cl.
*G06F 9/45* (2006.01)
*G06F 9/44* (2006.01)
*G06F 17/50* (2006.01)

(52) U.S. Cl.
CPC *G06F 8/41* (2013.01); *G06F 8/427* (2013.01); *G06F 8/443* (2013.01); *G06F 8/447* (2013.01); *G06F 9/444* (2013.01); *G06F 17/5045* (2013.01); *G06F 17/5054* (2013.01)

(58) Field of Classification Search
None
See application file for complete search history.

(56) References Cited

U.S. PATENT DOCUMENTS

| | | |
|---|---|---|
| 5,081,608 A | 1/1992 | Tamura et al. |
| 5,537,580 A | 7/1996 | Giomi et al. |
| 5,729,678 A | 3/1998 | Hunt et al. |
| 5,784,298 A | 7/1998 | Hershey et al. |
| 5,831,853 A | 11/1998 | Bobrow et al. |
| 6,262,594 B1 | 7/2001 | Cheung et al. |
| 6,507,903 B1 | 1/2003 | Beatty et al. |

(Continued)

FOREIGN PATENT DOCUMENTS

| | | |
|---|---|---|
| CN | 1894559 A | 1/2007 |
| CN | 101013452 A | 8/2007 |

(Continued)

OTHER PUBLICATIONS

"Chinese Application Serial No. 10756723.2, Amendment filed Aug. 22, 2013", w/English Claims, 18 pgs.

(Continued)

*Primary Examiner* — Chuck Kendall
(74) *Attorney, Agent, or Firm* — Schwegman Lundberg & Woessner, P.A.

(57) ABSTRACT

Apparatus, systems, and methods for a compiler are described. One such compiler converts source code into an automaton comprising states and transitions between the states, wherein the states in the automaton include a special purpose state that corresponds to a special purpose hardware element. The compiler converts the automaton into a netlist, and places and routes the netlist to provide machine code for configuring a target device.

20 Claims, 18 Drawing Sheets

(56) References Cited

U.S. PATENT DOCUMENTS

| | | |
|---|---|---|
| 6,564,336 B1 | 5/2003 | Majkowski |
| 6,748,588 B1 | 6/2004 | Fraser et al. |
| 6,832,378 B1 | 12/2004 | Beatty et al. |
| 7,020,850 B2 | 3/2006 | Raghavan et al. |
| 7,039,233 B2 | 5/2006 | Mori et al. |
| 7,140,018 B1 | 11/2006 | Beatty et al. |
| 7,170,891 B2 | 1/2007 | Messenger |
| 7,171,561 B2 | 1/2007 | Noga |
| 7,392,229 B2 | 6/2008 | Harris et al. |
| 7,392,409 B2 | 6/2008 | Tateyama |
| 7,487,131 B2 | 2/2009 | Harris et al. |
| 7,487,542 B2 | 2/2009 | Boulanger et al. |
| 7,505,893 B2 | 3/2009 | Mizutani et al. |
| 7,546,354 B1 | 6/2009 | Fan et al. |
| 7,693,853 B2 | 4/2010 | Bellamy et al. |
| 7,761,851 B2 | 7/2010 | Bailey et al. |
| 7,774,286 B1 | 8/2010 | Harris |
| 7,917,684 B2 | 3/2011 | Noyes et al. |
| 7,970,964 B2 | 6/2011 | Noyes |
| 8,051,022 B2 | 11/2011 | Pandya |
| 8,065,249 B1 | 11/2011 | Harris |
| 8,140,780 B2 | 3/2012 | Noyes |
| 8,601,013 B2 | 12/2013 | Dlugosch |
| 8,726,253 B2 * | 5/2014 | Glendenning et al. ........ 717/151 |
| 8,726,256 B2 | 5/2014 | Xu et al. |
| 8,788,991 B2 | 7/2014 | Xu et al. |
| 8,843,911 B2 | 9/2014 | Xu et al. |
| 2003/0014743 A1 | 1/2003 | Cooke et al. |
| 2003/0145304 A1 | 7/2003 | Carter |
| 2004/0133869 A1 | 7/2004 | Sharma |
| 2005/0268258 A1 | 12/2005 | Decker |
| 2006/0020589 A1 | 1/2006 | Wu et al. |
| 2007/0005355 A1 | 1/2007 | Tian et al. |
| 2007/0192110 A1 | 8/2007 | Mizutani et al. |
| 2007/0296458 A1 | 12/2007 | Kelem et al. |
| 2008/0140600 A1 | 6/2008 | Pandya |
| 2008/0141233 A1 | 6/2008 | Gurevich et al. |
| 2008/0168013 A1 | 7/2008 | Cadaret |
| 2008/0201281 A1 | 8/2008 | Graf et al. |
| 2010/0100518 A1 | 4/2010 | Andrade et al. |
| 2010/0100691 A1 | 4/2010 | Noyes et al. |
| 2010/0100714 A1 | 4/2010 | Noyes et al. |
| 2010/0115347 A1 | 5/2010 | Noyes |
| 2010/0118425 A1 | 5/2010 | Rafaelof |
| 2010/0121643 A1 | 5/2010 | Mohajer et al. |
| 2010/0131935 A1 | 5/2010 | Wang |
| 2010/0138432 A1 | 6/2010 | Noyes et al. |
| 2010/0138575 A1 | 6/2010 | Noyes |
| 2010/0138634 A1 | 6/2010 | Noyes et al. |
| 2010/0138635 A1 | 6/2010 | Noyes |
| 2010/0174887 A1 | 7/2010 | Pawlowski |
| 2010/0174929 A1 | 7/2010 | Pawlowski |
| 2010/0175130 A1 | 7/2010 | Pawlowski |
| 2010/0185647 A1 | 7/2010 | Noyes |
| 2010/0293153 A1 | 11/2010 | Zhao et al. |
| 2010/0325633 A1 | 12/2010 | Eguro et al. |
| 2010/0332809 A1 | 12/2010 | Noyes et al. |
| 2011/0145182 A1 | 6/2011 | Dlugosch et al. |
| 2011/0145271 A1 | 6/2011 | Noyes et al. |
| 2011/0145544 A1 | 6/2011 | Noyes et al. |
| 2011/0258360 A1 | 10/2011 | Noyes |
| 2011/0307433 A1 | 12/2011 | Dlugosch |
| 2011/0307503 A1 | 12/2011 | Dlugosch |
| 2012/0192163 A1 | 7/2012 | Glendenning et al. |
| 2012/0192164 A1 | 7/2012 | Xu et al. |
| 2012/0192165 A1 | 7/2012 | Xu et al. |
| 2012/0192166 A1 | 7/2012 | Xu et al. |
| 2014/0082009 A1 | 3/2014 | Dlugosch |
| 2014/0229926 A1 | 8/2014 | Xu et al. |
| 2014/0380288 A1 | 12/2014 | Xu et al. |
| 2015/0046889 A1 | 2/2015 | Xu et al. |

FOREIGN PATENT DOCUMENTS

| | | |
|---|---|---|
| CN | 101339501 A | 1/2009 |
| CN | 101360088 A | 2/2009 |
| CN | 101499065 A | 8/2009 |
| CN | 101099147 B | 5/2010 |
| CN | 103003792 A | 3/2013 |
| CN | 103430148 A | 12/2013 |
| CN | 103443767 A | 12/2013 |
| CN | 103547998 A | 1/2014 |
| CN | 103547999 A | 1/2014 |
| EP | 2184687 A1 | 5/2010 |
| JP | 04291662 A | 10/1992 |
| JP | 2002358500 A | 12/2002 |
| JP | 2005122466 A | 5/2005 |
| JP | 2005353061 A | 12/2005 |
| JP | 2009093599 A | 4/2009 |
| TW | 505854 B | 10/2002 |
| TW | 505855 B | 10/2002 |
| TW | 505856 B | 10/2002 |
| TW | 201237748 A | 9/2012 |
| TW | 201239765 A | 10/2012 |
| TW | 201246071 A | 11/2012 |
| TW | 201246081 A | 11/2012 |
| WO | WO-2009029698 A1 | 3/2009 |
| WO | WO-2010018710 A1 | 2/2010 |
| WO | WO-2011156634 A2 | 12/2011 |
| WO | WO-2011156634 A3 | 12/2011 |
| WO | WO-2012103143 A2 | 8/2012 |
| WO | WO-2012103146 A2 | 8/2012 |
| WO | WO-2012103148 A2 | 8/2012 |
| WO | WO-2012103151 A2 | 8/2012 |

OTHER PUBLICATIONS

"Chinese Application Serial No. 201180034987.3, Office Action mailed Mar. 4, 2014", w/English Translation, 21 pgs.

"Chinese Application Serial No. 201180034987.3, Office Action mailed Oct. 8, 2014", W/ English Translation, 18 pgs.

"Chinese Application Serial No. 201180034987.3, Response filed Jul. 17, 2014 to Office Action mailed Mar. 4, 2014", W/ English Claims, 4 pgs.

"Chinese Application Serial No. 201280012402.2, Amendment filed Jan. 16, 2014", W/ English Claims, 18 pgs.

"Chinese Application Serial No. 201280013903.2, Voluntary Amendment filed May 8, 2014", W/ English Translation, 27 pgs.

"Chinese Application Serial No. 201280013925.9 Response Filed Oct. 23, 2014 to Non-Final Office Action Mailed Sep. 23, 2014", With the English claims, 19 pgs.

"Chinese Application Serial No. 201280013925.9, Amendment filed Jan. 26, 2014", w/English Claims, 13 pgs.

"Chinese Application Serial No. 201280013925.9, Office Action mailed Mar. 3, 2014", w/English Translation, 10 pgs.

"Chinese Application Serial No. 201280013925.9, Office Action mailed Aug. 8, 2014", W/ English Translation, 13 pgs.

"Chinese Application Serial No. 201280013925.9, Response filed Jul. 16, 2014 to Office Action mailed Mar. 3, 2014", W/ English Claims, 14 pgs.

"European Application Serial No. 11793185.7, Amendment field Sep. 3, 2013", 7 pgs.

"European Application Serial No. 12739387.4, Extended European Search Report mailed May 27, 2014", 8 pgs.

"European Application Serial No. 12739387.4, Office Action mailed Sep. 13, 2013", 2 pgs.

"European Application Serial No. 12739387.4, Response filed Mar. 21, 2014 to Office Action mailed Sep. 13, 2013", 12 pgs.

"European Application Serial No. 12739387.4, Response filed Nov. 27, 2014 to Extended European Search Report mailed May 27, 2014", 11 pgs.

"European Application Serial No. 12739626.5, Extended European Search Report mailed Jun. 18, 2014", 7 pgs.

"European Application Serial No. 12739626.5, Office Action mailed Sep. 17, 2013", 2 pgs.

"European Application Serial No. 12739626.5, Response filed Mar. 21, 2014 to Office Action mailed Sep. 17, 2013", 10 pgs.

(56) References Cited

OTHER PUBLICATIONS

"European Application Serial No. 12739626.5, Response filed Dec. 11, 2014 to European Extended Search Report mailed Jun. 18, 2014", 11 pgs.
"European Application Serial No. 12739650.5, Office Action mailed Sep. 13, 2013", 2 pgs.
"European Application Serial No. 12739650.5, Response filed Mar. 21, 2014 to Office Action mailed Sep. 13, 2013", 12 pgs.
"European Application Serial No. 12739652.1, Office Action mailed Sep. 13, 2013", 2 pgs.
"European Application Serial No. 12739652.1, Response filed Mar. 21, 2014 to Office Action mailed Sep. 13, 2013", 8 pgs.
"International Application Serial No. PCT/US2011/039849, International Preliminary Report on Patentability mailed Dec. 20, 2012", 6 pgs.
"International Application Serial No. PCT/US2011/039849, International Search Report mailed Feb. 9, 2012", 3 pgs.
"International Application Serial No. PCT/US2011/039849, Written Opinion mailed Feb. 9, 2012", 4 pgs.
"International Application Serial No. PCT/US2012/022439, International Preliminary Report on Patentability mailed Aug. 8, 2013", 6 pgs.
"International Application Serial No. PCT/US2012/022439, Search Report mailed Sep. 10, 2012", 3 pgs.
"International Application Serial No. PCT/US2012/022439, Written Opinion mailed Sep. 10, 2012", 4 pgs.
"International Application Serial No. PCT/US2012/022441, International Preliminary Report on Patentability mailed Aug. 8, 2013", 6 pgs.
"International Application Serial No. PCT/US2012/022441, Search Report mailed Aug. 31, 2012", 3 pgs.
"International Application Serial No. PCT/US2012/022441, Written Opinion mailed Aug. 31, 2012", 4 pgs.
"International Application Serial No. PCT/US2012/022441, Written Opinion mailed Aug. 31, 2012", 3 pgs.
"International Application Serial No. PCT/US2012/022444, International Preliminary Report on Patentability mailed Aug. 8, 2013", 5 pgs.
"International Application Serial No. PCT/US2012/022444, Search Report mailed Aug. 31, 2012", 3 pgs.
"Japanese Application Serial No. 2013-514372 Response Filed Nov. 4, 2014 to Non-Final Office Action mailed Aug. 5, 2014", With the English claims, 19 pgs.
"Japanese Application Serial No. 2013-514372, Office Action mailed Aug. 5, 2014", W/ English Translation, 12 pgs.
"Taiwan Application Serial No. 100120418 Response Filed Nov. 11, 2014 to Non-Final Office Action Mailed Aug. 11, 2014", With the English claims, 46 pgs.
"Taiwanese Application Serial No. 100120418, Office Action mailed Aug. 11, 2014", W/ English Translation, 6 pgs.
Badii, Atta, et al., "Efficient FPGA-based regular expression pattern matching", European and Mediterranean Conference on Information Systems A1 Bustan Rotana Hotel, [Online]. Retrieved from the Internet: <http://www.researchgate.net/publication/228810333_Efficient_FPGA_based_regular_expression_pattern_matching/file/9fcfd50e5e78229189.pdf>, (Mar. 25, 2008), 1-12.
Li, Lin, "On Algebraic Properties of State Machines", Master's Thesis—Guangxi Normal University, (Jan. 1, 2007), 31-34.
Mitra, Abhishek, et al., "Compiling PCRE to FPGA for Accelerating SNORT IDS", ACM/IEEE Symposium on Architectures for Networking and Communications Systems, (Dec. 2007), 9 pgs.
Sidhu, Reetinder, et al., "Fast Regular Expression Matching using FPGAs", IEEE Symposium on Field Programmable Custom Computing Machines (FCCM 2001), (Apr. 2001), 227-238.

Vasiliadis, Giorgos, et al., "Regular Expression Matching on Graphics Hardware for Intrusion Detection", Proceedings of the 12th International Symposium on Recent Advances in Intrusion Detection, See pp. 267-270, 272-274, (2009), 265-283.
Vassilios, Karakoidas, et al., "FIRE/J Optimizing Regular Expression Searches With Generative Programming", Software Practice & Experience, Wiley & Sons, vol. 38, No. 6, (Jul. 23, 2007), 557-573.
Yang, Yi-Hua E, et al., "Compact Architecture for High-Throughput regular expression matching on FPGA", Architectures for Networking and Communications Systems; 20081106-20081107, (Nov. 6, 2008), 30-39.
Zhang, C, et al., "Intrusion Detection Using Hierarchical Neural Networks", Pattern Recognition Letters, 26(6), (May 1, 2005), 779-791.
"International Application Serial No. PCT/US2012/022435, International Preliminary Report on Patentability mailed Aug. 8, 2013", 8 pgs.
"International Application Serial No. PCT/US2012/022435, Search Report mailed Aug. 31, 2012", 3 pgs.
"International Application Serial No. PCT/US2012/022435, Written Opinion mailed Aug. 31, 2012", 6 pgs.
Yang, Jeehong, et al., "An Approach to Graph and Netlist Compression", Data Compression Conference, [Online]. Retrieved from the Internet: <URL: http://comparch.doc.ic.ac.uk/publications/files/Jeehong08Dcc08.pdf>, (2008), 33-42.
"AdaBoost Parallelization on PC Clusters with Virtual Shared Memory for Fast Feature Selection", IEEE International Conference on Signal Processing and Communications, (Nov. 2007), 165-168.
"Chinese Application Serial No. 201180034987.3 Response filed Dec. 19, 2014 to Non-Final Office Action mailed Oct. 8, 2014", W/ English claims, 21 pgs.
"Chinese Application Serial No. 201280013925.9 Response filed Mar. 6, 2015 to Office Action mailed Dec. 22, 2014", W/ English Claims, 3 pgs.
"Chinese Application Serial No. 201280013925.9, Office Action mailed Dec. 22, 2014", W/ English Translation, 4 pgs.
"Japanese Application Serial No. 2013-550670 Office Action mailed Mar. 17, 2015", W/ English Translation, 6 pgs.
"Japanese Application Serial No. 2013-514372 Response filed Mar. 5, 2015 to Office Action mailed Aug. 5, 2014", With the English claims, 17 pgs.
"Japanese Application Serial No. 2013-514372, Response filed Mar. 5, 2015 to Final Office Action mailed Dec. 9, 2014", W/ English Claims, 17 pgs.
"Japanese Application Serial No. 2013-550671, Amendment filed Jan. 22, 2015", W/ English Claims, 7 pgs.
"Japanese Application Serial No. 2013-550671, Notice of Rejection mailed Mar. 24, 2015", With English Translation, 7 pgs.
"Japanese Application Serial No. 2013-550672, Preliminary Amendment filed on Jan. 22, 2015", W/ English Claims, 17 pgs.
"Taiwan Application Serial No. 100120418 Response filed Apr. 10, 2015 to Office Action mailed Feb. 5, 2015", W/ English Claims, 5 pgs.
"Taiwanese Application Serial No. 100120418, Office Action mailed Jan. 12, 2015", W/ English Translation, 28 pgs.
Polikar, R, "Ensemble Based Systems in Decision Making", IEEE Circuits and Systems Magazine, vol. 6, No. 3, (2006), 21-45.
Shinya, Ryoma, et al., "Implementation of Regular Expression Engine with Dynamic Code Generation", (Jan. 2011), 173-180.
Shinya, Ryoma, et al., "Implementation of Regular Expression Engine with Dynamic Code Generation.", Information Processing Society 52nd Programming Symposium, W/ Machine Translation, 22 pgs.

\* cited by examiner abb?(b|c){1, 2}

SS(abb?(b|c){1, 2})

METHOD AND APPARATUS FOR COMPILING REGULAR EXPRESSIONS

CLAIM OF PRIORITY

This patent application is a continuation of U.S. application Ser. No. 13/357,472, filed Jan. 24, 2012 and now issued as U.S. Pat. No. 8,726,253, which claims the benefit of priority, under 35 U.S.C. Section 119(e), to U.S. Provisional Patent Application Ser. No. 61/436,013, titled "METHOD AND APPARATUS FOR COMPILING REGULAR EXPRESSIONS," filed on Jan. 25, 2011, all of which are hereby incorporated by reference herein in their entirety.

BACKGROUND

A finite state machine (FSM) (also referred to as a finite-state automaton, automaton, or simply a state machine) is a representation of states, transitions between states and actions. A finite state machine can be used to design digital logic, computer programs, or images for a parallel machine. A finite state machine is a model of behavior composed of a finite number of states, transitions between those states, and outputs. A finite state machine can be represented as a graph where the vertices of the graph correspond to states of the finite state machine and the edges of the graph correspond to transitions between states which occur due to one or more inputs to the finite state machine. Finite state machines can also have probabilistic transitions, fuzzy states, or other oddities. A finite state machine has a finite internal memory, an input feature, and an optional output feature. Finite state machines with an output can be referred to as finite state transducers.

Applications of finite state machines include electronic design automation, communication protocol design, biology and artificial intelligence research, and linguistics to describe the grammars of natural languages.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

This document describes, among other things, a compiler for converting source code (e.g., regular expressions) into machine code (e.g., image for configuring (e.g., programming) a parallel machine. The image (output file) produced by the compiler can program the parallel machine to perform certain functions. In certain examples, the parallel machine can include a finite state machine (FSM) engine, a field programmable gate array (FPGA), and variations thereof.

Figure 1:
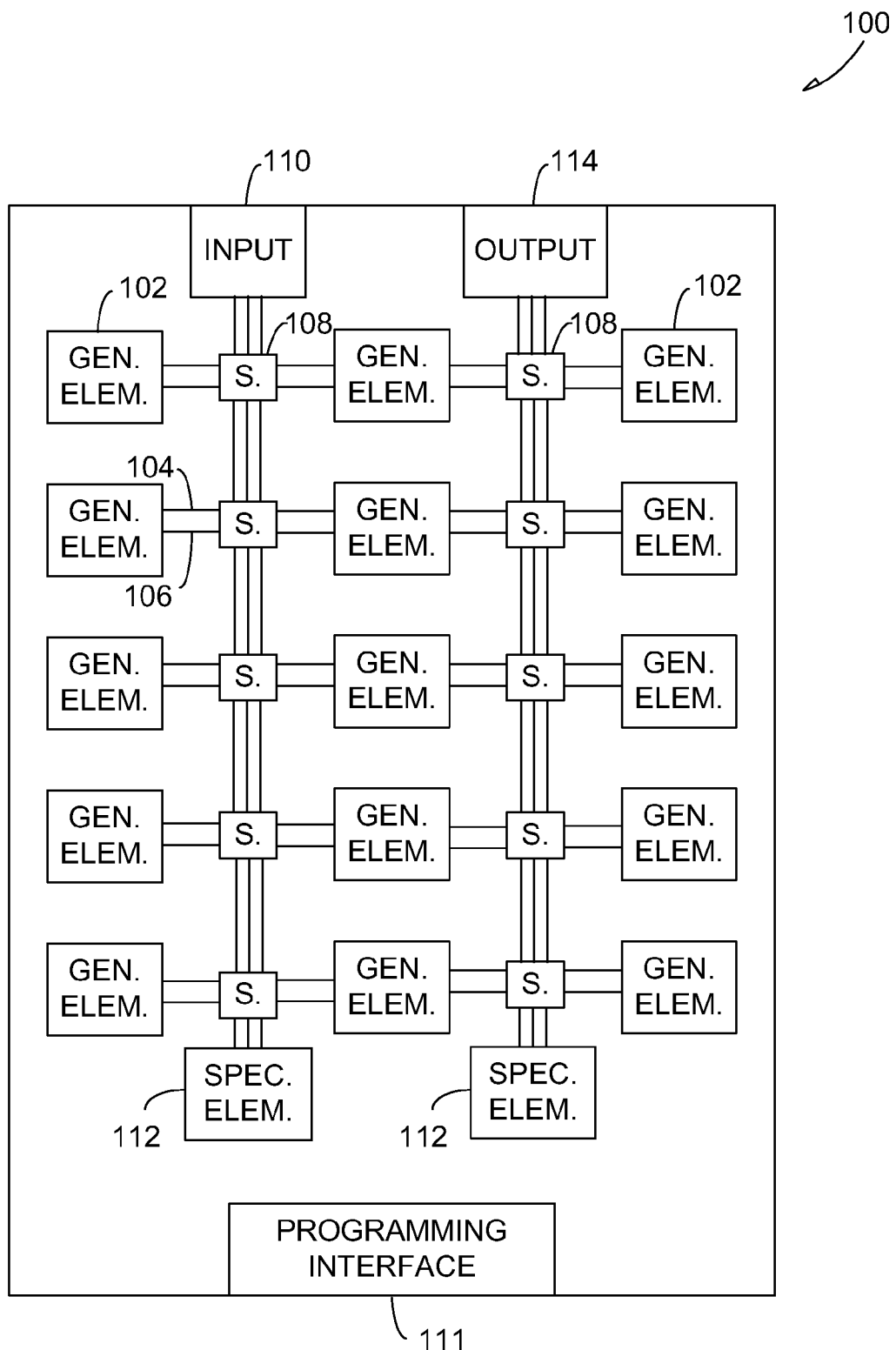
FIG. 1 illustrates an example of a parallel machine, according to various embodiments of the invention.

FIG. 1 illustrates an example of a target device (e.g., parallel machine 100). The parallel machine 100 can receive input data and provide an output based on the input data. The parallel machine 100 can include a data input port 110 for receiving input data and an output port 114 for providing an output to another device. The data input port 110 provides an interface for data to be input to the parallel machine 100.

The parallel machine 100 includes a plurality of programmable elements including general purpose elements 102 and special purpose elements 112. A general purpose element 102 can include one or more inputs 104 and one or more outputs 106. A general purpose element 102 can be programmed into one of a plurality of states. The state of the general purpose element 102 determines what output(s) the general purpose elements 102 will provide based on a given input(s). That is, the state of the general purpose element 102 determines how the programmable element will react (e.g., respond) to a given input. Data input to the data input port 110 can be provided to the plurality of general purpose elements 102 to cause the general purpose elements 102 to take action thereon. Examples of a general purpose element 102 can include, for example, a state machine element (SME), as discussed in detail below, a counter, and/or a configurable logic block, among other programmable elements. In an example, a SME can be programmed (e.g., set) to provide a certain output (e.g., a high or "1" signal) when a given input is received at the data input port 110. When an input other than the given input is received at the data input port 110, the SME can provide a different output (e.g., a low or "0" signal). In an example, a configurable logic block can be set to perform a Boolean logic function (e.g., AND, OR, NOR, ext.) based on input received at the data input port 110. An example of a counter is discussed later herein. A special purpose element 112 can include memory (e.g., RAM), logic gates, counters, look-up tables, field programmable gate arrays (FPGAs), and other hardware elements. A special purpose element 112 can interact with the general purpose elements 102 and performing special purpose functions.

The parallel machine 100 can also include a programming interface 111 for loading a program (e.g., an image) onto the parallel machine 100. The image can program (e.g., set) the state of the general purpose elements 102. That is, the image can configure the general purpose elements 102 to react in a certain way to a given input. For example, a general purpose element 102 can be set to output a high signal when the character 'a' is received at the data input port 110. In some examples, the parallel machine 100 can use a clock signal for controlling the timing of operation of the general purpose elements 102. In some embodiments, the data received at the data input port 110 can include a fixed set of data received over time or all at once, or a stream of data received over time. The data may be received from, or generated by, any source, such as databases, sensors, networks, etc, coupled to the parallel machine 100.

Figure 2:
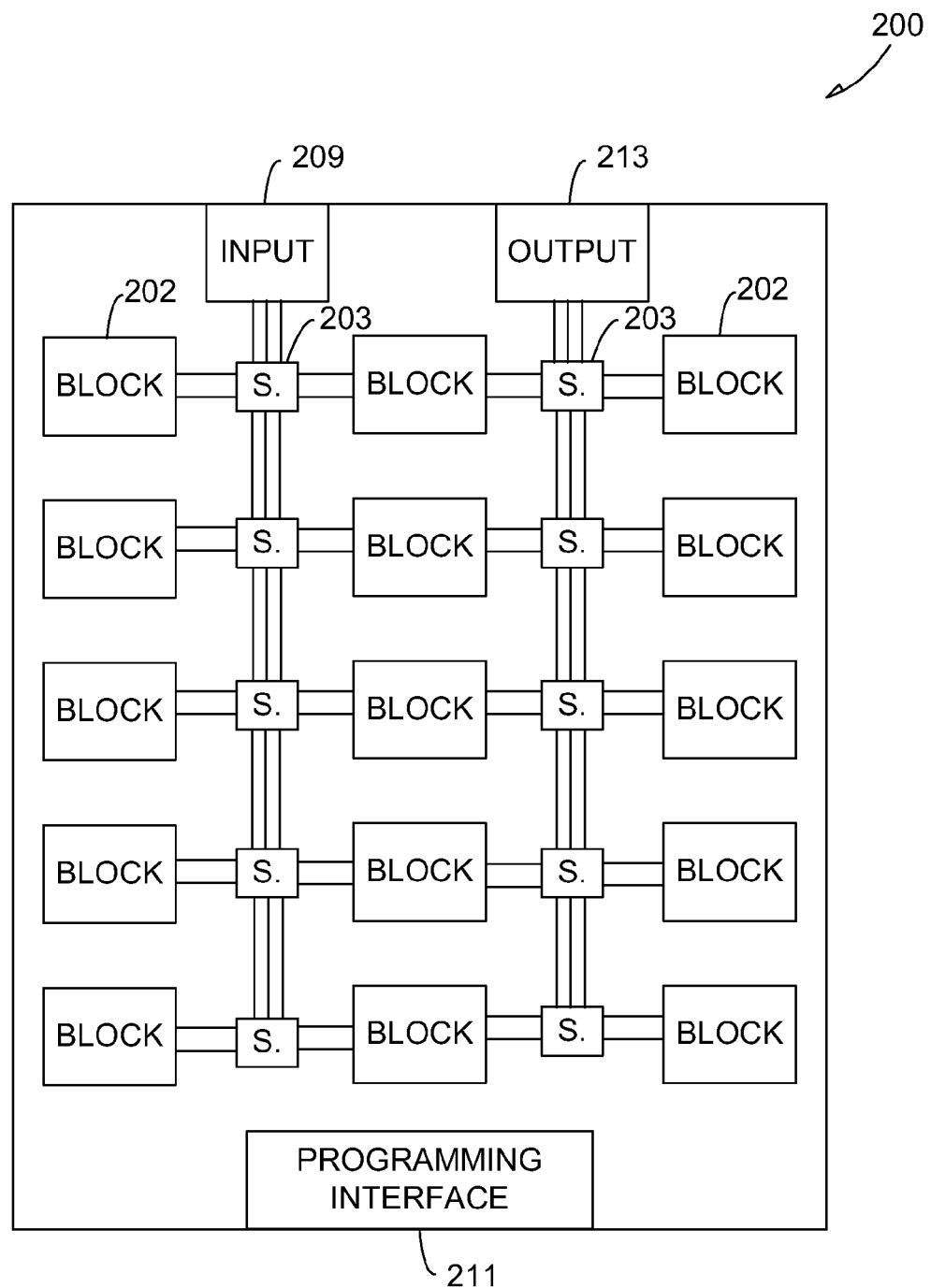
FIG. 2 illustrates an example of the parallel machine of FIG. 1 implemented as a finite state machine engine, according to various embodiments of the invention.

The parallel machine 100 also includes a plurality of programmable switches 108 for selectively coupling together different elements (e.g., general purpose element 102, data input port 110, output port 114, programming interface 111, and special purpose elements 112) of the parallel machine 100. Accordingly, the parallel machine 100 comprises a programmable matrix formed among the elements. In an example, a programmable switch 108 can selectively couple two or more elements to one another such that an input 104 of a general purpose element 102, the data input port 110, a programming interface 111, or special purpose element 112 can be coupled through one or more programmable switches 108 to an output 106 of a general purpose element 102, the output port 114, a programming interface 111, or special purpose element 112. Thus, the routing of signals between the elements can be controlled by setting the programmable switches 108. Although FIG. 1 illustrates a certain number of conductors (e.g., wires) between a given element and a programmable switch 108, it should be understood that in other examples, a different number of conductors can be used. Also, although FIG. 1 illustrates each general purpose element 102 individually coupled to a programmable switch 108, in other examples, multiple general purpose elements 102 can be coupled as a group (e.g., a block 202, as illustrated in FIG. 2) to a programmable switch 108. In an example, the data input port 110, the data output port 114, and/or the programming interface 111 can be implemented as registers such that writing to the registers provides data to or from the respective elements.

In an example, a single parallel machine 100 is implemented on a physical device, however, in other examples two or more parallel machines 100 can be implemented on a single physical device (e.g., physical chip). In an example, each of multiple parallel machines 100 can include a distinct data input port 110, a distinct output port 114, a distinct programming interface 111, and a distinct set of general purpose elements 102. Moreover, each set of general purpose elements 102 can react (e.g., output a high or low signal) to data at their corresponding input data port 110. For example, a first set of general purpose elements 102 corresponding to a first parallel machine 100 can react to the data at a first data input port 110 corresponding to the first parallel machine 100. A second set of general purpose elements 102 corresponding to a second parallel machine 100 can react to a second data input port 110 corresponding to the second parallel machine 100. Accordingly, each parallel machine 100 includes a set of general purpose elements 102, wherein different sets of general purpose elements 102 can react to different input data. Similarly, each parallel machine 100, and each corresponding set of general purpose elements 102 can provide a distinct output. In some examples, an output port 114 from first parallel machine 100 can be coupled to an input port 110 of a second parallel machine 100, such that input data for the second parallel machine 100 can include the output data from the first parallel machine 100.

In an example, an image for loading onto the parallel machine 100 comprises a plurality of bits of information for setting the state of the general purpose elements 102, programming the programmable switches 108, and configuring the special purpose elements 112 within the parallel machine 100. In an example, the image can be loaded onto the parallel machine 100 to program the parallel machine 100 to provide a desired output based on certain inputs. The output port 114 can provide outputs from the parallel machine 100 based on the reaction of the general purpose elements 102 to data received at the input port 110. An output from the output port 114 can include a single bit indicating a match of a given pattern, a word comprising a plurality of bits indicating matches and non-matches to a plurality of patterns, and an output vector corresponding to the state of all or certain general purpose elements 102 at a given moment.

Example uses for the parallel machine 100 include, pattern-recognition (e.g., speech recognition, image recognition, etc.) signal processing, imaging, computer vision, cryptography, and others. In certain examples, the parallel machine 100 can comprise a finite state machine (FSM) engine, a field programmable gate array (FPGA), and variations thereof. Moreover, the parallel machine 100 may be a component in a larger device such as a computer, pager, cellular phone, personal organizer, portable audio player, network device (e.g., router, firewall, switch, or any combination thereof), control circuit, camera, etc.

FIGS. 2-5 illustrate another parallel machine implemented as a finite state machine (FSM) engine 200. In an example, the FSM engine 200 comprises a hardware implementation of a finite state machine. Accordingly, the FSM engine 200 implements a plurality of selectively coupleable hardware elements (e.g., programmable elements) that correspond to a plurality of states in a FSM. Similar to a state in a FSM, a hardware element can analyze an input stream and activate a downstream hardware element based on the input stream.

The FSM engine 200 includes a plurality of programmable elements including general purpose elements and special purpose elements. The general purpose elements can be programmed to implement many different functions. These general purpose elements include SMEs 204, 205 (shown in FIG. 5) that are hierarchically organized into rows 206 (shown in FIGS. 3 and 4) and blocks 202 (shown in FIGS. 2 and 3). To route signals between the hierarchically organized SMEs 204, 205, a hierarchy of programmable switches is used including inter-block switches 203 (shown in FIGS. 2 and 3), intra-block switches 208 (shown in FIGS. 3 and 4) and intra-row switches 212 (shown in FIG. 4). A SME 204, 205 can correspond to a state of a FSM implemented by the FSM engine 200. The SMEs 204, 205 can be coupled together by using the programmable switches as described below. Accordingly, a FSM can be implemented on the FSM engine 200 by programming the SMEs 204, 205 to correspond to the functions of states and by selectively coupling together the SMEs 204, 205 to correspond to the transitions between states in the FSM.

FIG. 2 illustrates an overall view of an example FSM engine 200. The FSM engine 200 includes a plurality of blocks 202 that can be selectively coupled together with programmable inter-block switches 203. Additionally, the blocks 202 can be selectively coupled to an input block 209 (e.g., a data input port) for receiving signals (e.g., data) and providing the data to the blocks 202. The blocks 202 can also be selectively coupled to an output block 213 (e.g., an output port) for providing signals from the blocks 202 to an external device (e.g., another FSM engine 200). The FSM engine 200 can also include a programming interface 211 to load a program (e.g., an image) onto the FSM engine 200. The image can program (e.g., set) the state of the SMEs 204, 205. That is, the image can configure the SMEs 204, 205 to react in a certain way to a given input at the input block 209. For example, a SME 204 can be set to output a high signal when the character 'a' is received at the input block 209.

In an example, the input block 209, the output block 213, and/or the programming interface 211 can be implemented as registers such that writing to the registers provides data to or from the respective elements. Accordingly, bits from the image stored in the registers corresponding to the programming interface 211 can be loaded on the SMEs 204, 205. Although FIG. 2 illustrates a certain number of conductors (e.g., wire, trace) between a block 202, input block 209, output block 213, and an inter-block switch 203, it should be understood that in other examples, fewer or more conductors can be used.

Figure 3:
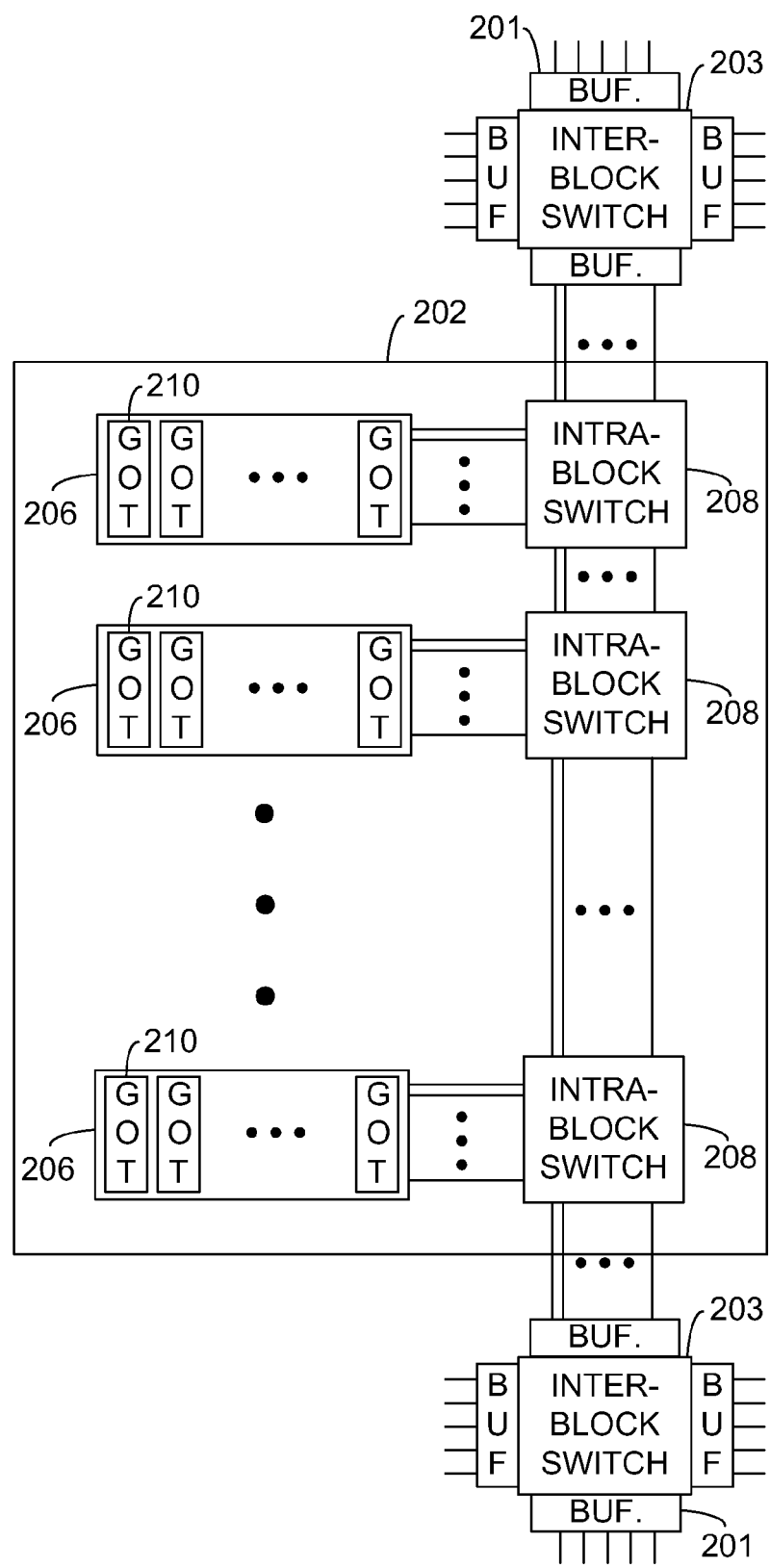
FIG. 3 illustrates an example of a block of the finite state machine engine of FIG. 2, according to various embodiments of the invention.

FIG. 3 illustrates an example of a block 202. A block 202 can include a plurality of rows 206 that can be selectively coupled together with programmable intra-block switches 208. Additionally, a row 206 can be selectively coupled to another row 206 within another block 202 with the inter-block switches 203. In an example, buffers 201 are included to control the timing of signals to/from the inter-block switches 203. A row 206 includes a plurality of SMEs 204, 205 organized into pairs of elements that are referred to herein as groups of two (GOTs) 210. In an example, a block 202 comprises sixteen (16) rows 206.

Figure 4:
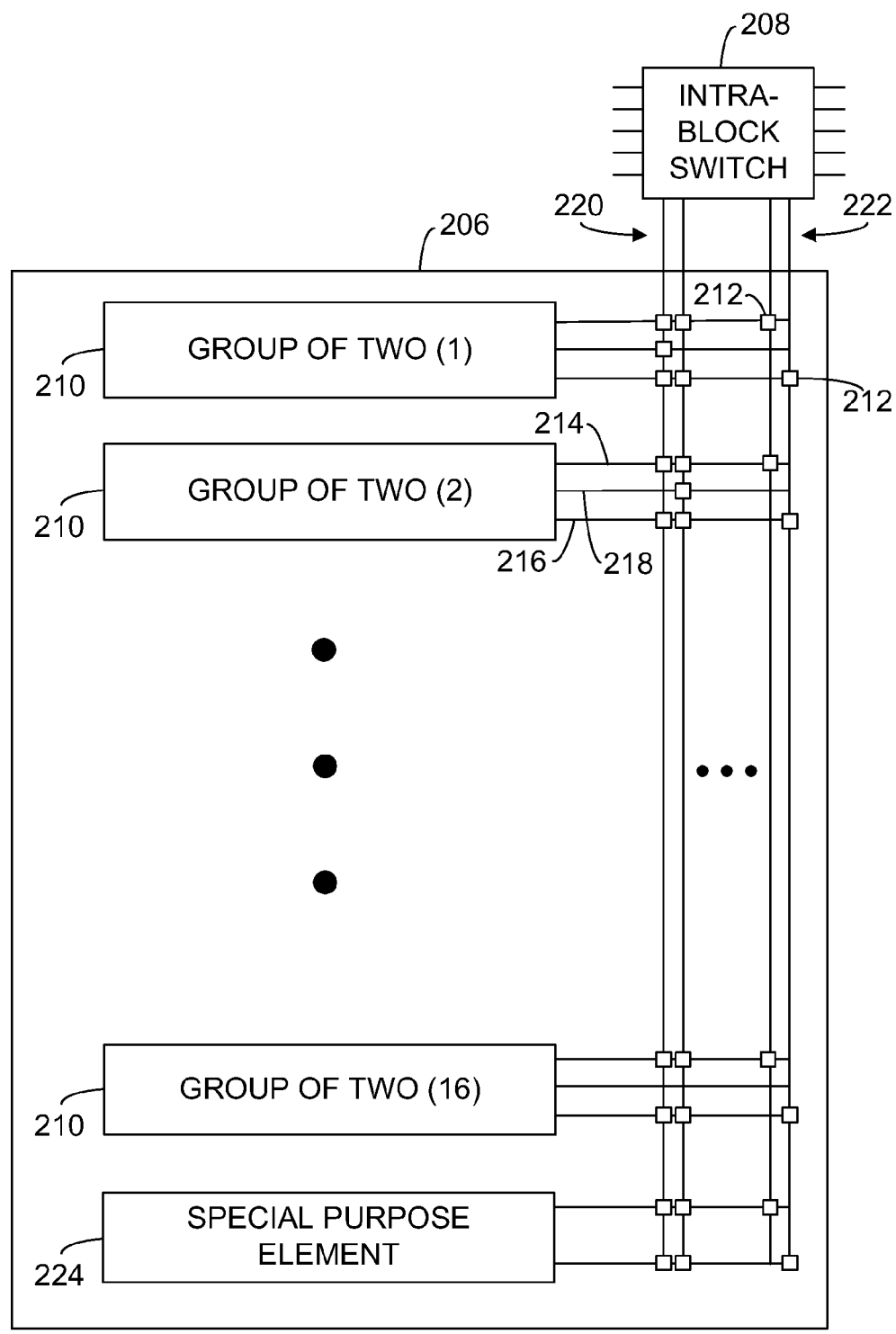
FIG. 4 illustrates an example of a row of the block of FIG. 3, according to various embodiments of the invention.

FIG. 4 illustrates an example of a row 206. A GOT 210 can be selectively coupled to other GOTs 210 and any other elements 224 within the row 206 by programmable intra-row switches 212. A GOT 210 can also be coupled to other GOTs 210 in other rows 206 with the intra-block switch 208, or other GOTs 210 in other blocks 202 with an inter-block switch 203. In an example, a GOT 210 has a first and second input 214, 216, and an output 218. The first input 214 is coupled to a first SME 204 of the GOT 210 and the second input 214 is coupled to a second SME 204 of the GOT 210.

In an example, the row 206 includes a first and second plurality of row interconnection conductors 220, 222. In an example, an input 214, 216 of a GOT 210 can be coupled to one or more row interconnection conductors 220, 222, and an output 218 can be coupled to one row interconnection conductor 220, 222. In an example, a first plurality of the row interconnection conductors 220 can be coupled to each SME 204 of each GOT 210 within the row 206. A second plurality of the row interconnection conductors 222 can be coupled to one SME 204 of each GOT 210 within the row 206, but cannot be coupled to the other SME 204 of the GOT 210. In an example, a first half of the second plurality of row interconnection conductors 222 can couple to first half of the SMEs 204 within a row 206 (one SME 204 from each GOT 210) and a second half of the second plurality of row interconnection conductors 222 can couple to a second half of the SMEs 204 within a row 206 (the other SME 204 from each GOT 210). The limited connectivity between the second plurality of row interconnection conductors 222 and the SMEs 204, 205 is referred to herein as "parity".

In an example, the row 206 can also include a special purpose element 224 such as a counter, a programmable Boolean logic element, a field programmable gate array (FPGA), an application specific integrated circuit (ASIC), a programmable processor (e.g., a microprocessor), and other elements. Additionally, in an example, the special purpose element 224 is different in different rows 206. For example four of the rows 206 in a block 202 can include Boolean logic as the special purpose element 224, and the other eight rows 206 in a block 202 can include a counter as the special purpose element 224.

In an example, the special purpose element 224 includes a counter (also referred to herein as counter 224). In an example, the counter 224 comprises a 12-bit programmable down counter. The 12-bit programmable counter 224 has a counting input, a reset input, and zero-count output. The counting input, when asserted, decrements the value of the counter 224 by one. The reset input, when asserted, causes the counter 224 to load an initial value from an associated register. For the 12-bit counter 224, up to a 12-bit number can be loaded in as the initial value. When the value of the counter 224 is decremented to zero (0), the zero-count output is asserted. The counter 224 also has at least two modes, pulse and hold. When the counter 224 is set to pulse mode, the zero-count output is asserted during the first clock cycle when the counter 224 decrements to zero, and at the following clock cycles the zero-count output is no longer asserted even if the counting input is asserted. This state continues until the counter 224 is reset by the reset input being asserted. When the counter 224 is set to hold mode the zero-count output is asserted during the first clock cycle when the counter 224 decrements to zero, and stays asserted when the counting input is asserted until the counter 224 is reset by the reset input being asserted.

Figure 5:
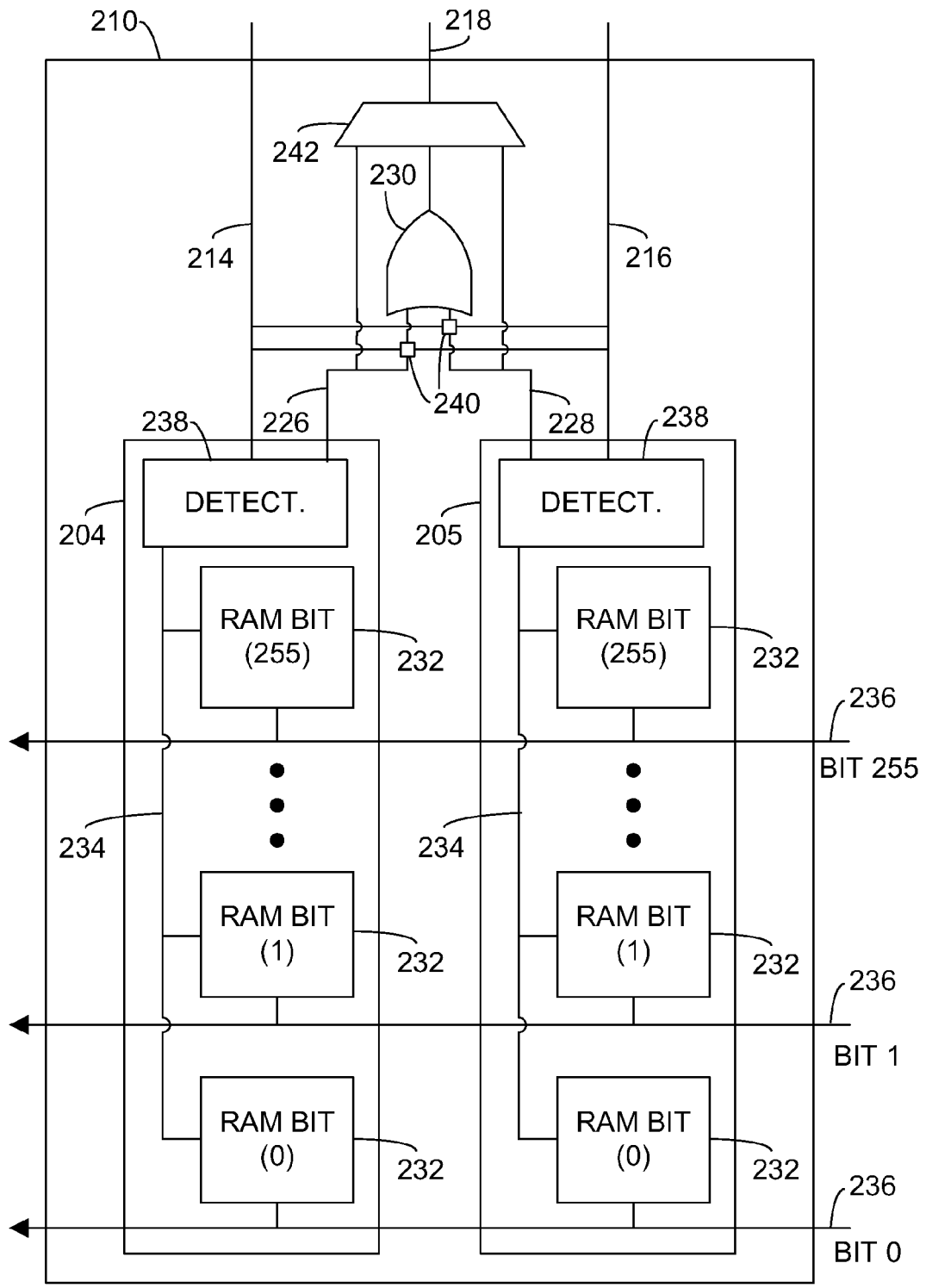
FIG. 5 illustrates an example of a group of two of the row of FIG. 4, according to various embodiments of the invention.

FIG. 5 illustrates an example of a GOT 210. The GOT 210 includes a first SME 204 and a second SME 205 having inputs 214, 216 and having their outputs 226, 228 coupled to an OR gate 230 and a 3-to-1 multiplexer 242. The 3-to-1 multiplexer 242 can be set to couple the output 218 of the GOT 210 to either the first SME 204, the second SME 205, or the OR gate 230. The OR gate 230 can be used to couple together both outputs 226, 228 to form the common output 218 of the GOT 210. In an example, the first and second SME 204, 205 exhibit parity, as discussed above, where the input 214 of the first SME 204 can be coupled to some of the row interconnect conductors 222 and the input 216 of the second SME 205 can be coupled to other row interconnect conductors 222. In an example, the two SMEs 204, 205 within a GOT 210 can be cascaded and/or looped back to themselves by setting either or both of switches 240. The SMEs 204, 205 can be cascaded by coupling the output 226, 228 of the SMEs 204, 205 to the input 214, 216 of the other SME 204, 205. The SMEs 204, 205 can be looped back to themselves by coupling the output 226, 228 to their own input 214, 216. Accordingly, the output 226 of the first SME 204 can be coupled to neither, one, or both of the input 214 of the first SME 204 and the input 216 of the second SME 205.

In an example, a state machine element 204, 205 comprises a plurality of memory cells 232, such as those often used in dynamic random access memory (DRAM), coupled in parallel to a detect line 234. One such memory cell 232 comprises a memory cell that can be set to a data state, such as one that corresponds to either a high or a low value (e.g., a 1 or 0). The output of the memory cell 232 is coupled to the detect line 234 and the input to the memory cell 232 receives signals based on data on the data stream line 236. In an example, an input on the data stream line 236 is decoded to select one of the memory cells 232. The selected memory cell 232 provides its stored data state as an output onto the detect line 234. For example, the data received at the data input port 209 can be provided to a decoder (not shown) and the decoder can select one of the data stream lines 236. In an example, the decoder can convert an ACSII character to 1 of 256 bits.

A memory cell 232, therefore, outputs a high signal to the detect line 234 when the memory cell 232 is set to a high value and the data on the data stream line 236 corresponds to the memory cell 232. When the data on the data stream line 236 corresponds to the memory cell 232 and the memory cell 232 is set to a low value, the memory cell 232 outputs a low signal to the detect line 234. The outputs from the memory cells 232 on the detect line 234 are sensed by a detect circuit 238. In an example, the signal on an input line 214, 216 sets the respective detect circuit 238 to either an active or inactive state. When set to the inactive state, the detect circuit 238 outputs a low signal on the respective output 226, 228 regardless of the signal on the respective detect line 234. When set to an active state, the detect circuit 238 outputs a high signal on the respective output line 226, 228 when a high signal is detected from one of the memory cells 234 of the respective SME 204, 205. When in the active state, the detect circuit 238 outputs a low signal on the respective output line 226, 228 when the signals from all of the memory cells 234 of the respective SME 204, 205 are low.

In an example, an SME 204, 205 includes 256 memory cells 232 and each memory cell 232 is coupled to a different data stream line 236. Thus, an SME 204, 205 can be programmed to output a high signal when a selected one or more of the data stream lines 236 have a high signal thereon. For example, the SME 204 can have a first memory cell 232 (e.g., bit 0) set high and all other memory cells 232 (e.g., bits 1-255) set low. When the respective detect circuit 238 is in the active state, the SME 204 outputs a high signal on the output 226 when the data stream line 236 corresponding to bit 0 has a high signal thereon. In other examples, the SME 204 can be set to output a high signal when one of multiple data stream lines 236 have a high signal thereon by setting the appropriate memory cells 232 to a high value.

In an example, a memory cell 232 can be set to a high or low value by reading bits from an associated register. Accordingly, the SMEs 204 can be programmed by storing an image created by the compiler into the registers and loading the bits in the registers into associated memory cells 232. In an example, the image created by the compiler includes a binary image of high and low (e.g., 1 and 0) bits. The image can program the FSM engine 200 to operate as a FSM by cascading the SMEs 204, 205. For example, a first SME 204 can be set to an active state by setting the detect circuit 238 to the active state. The first SME 204 can be set to output a high signal when the data stream line 236 corresponding to bit 0 has a high signal thereon. The second SME 205 can be initially set to an inactive state, but can be set to, when active, output a high signal when the data stream line 236 corresponding to bit 1 has a high signal thereon. The first SME 204 and the second SME 205 can be cascaded by setting the output 226 of the first SME 204 to couple to the input 216 of the second SME 205. Thus, when a high signal is sensed on the data stream line 236 corresponding to bit 0, the first SME 204 outputs a high signal on the output 226 and sets the detect circuit 238 of the second SME 205 to an active state. When a high signal is sensed on the data stream line 236 corresponding to bit 1, the second SME 205 outputs a high signal on the output 228 to activate another SME 205 or for output from the FSM engine 200.

Figure 6:
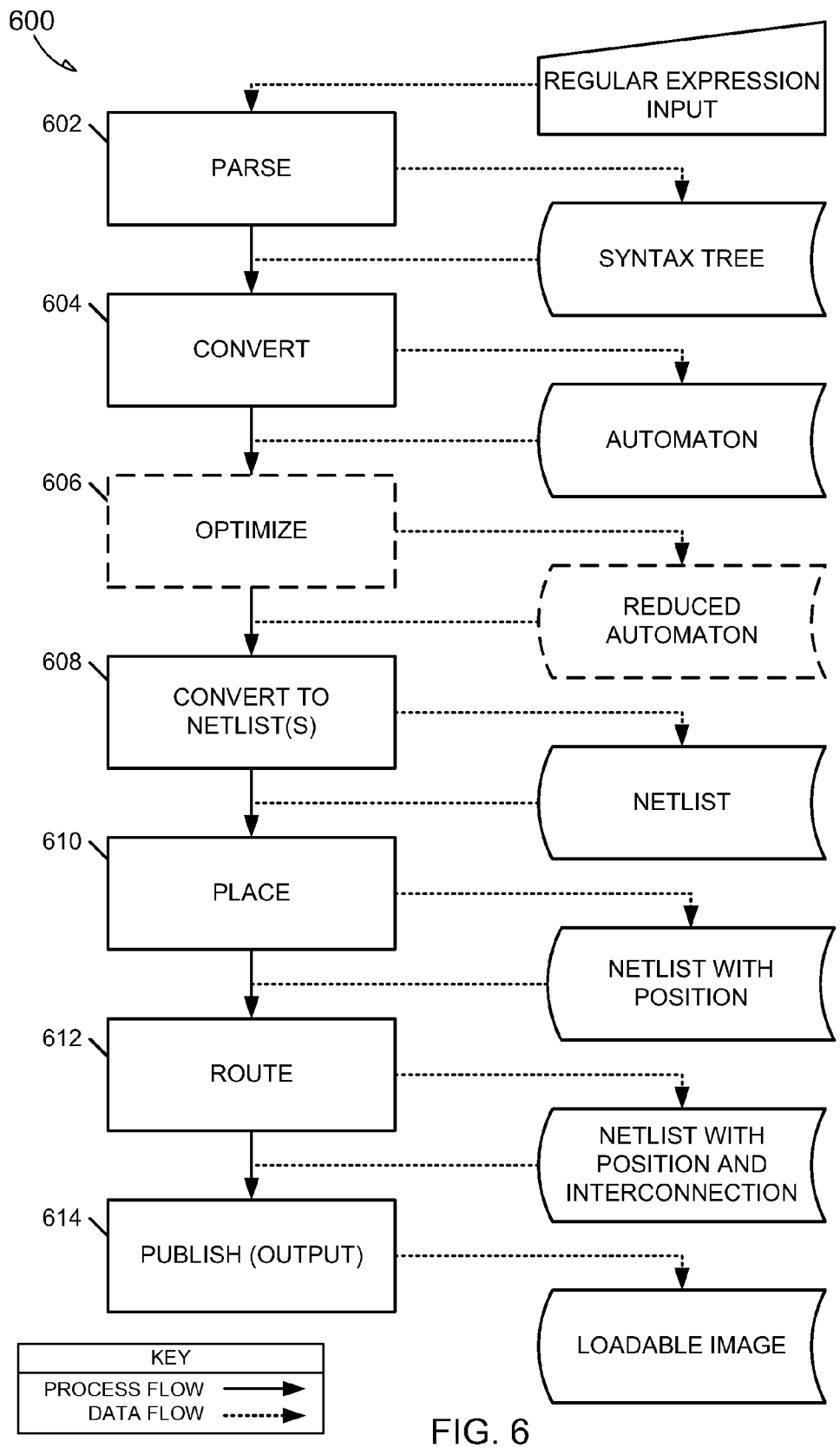
FIG. 6 illustrates an example of a method for a compiler to convert source code into an image configured to program the parallel machine of FIG. 1, according to various embodiments of the invention.

FIG. 6 illustrates an example of a method 600 for a compiler to convert source code into an image configured to program a parallel machine. Method 600 includes parsing the source code into a syntax tree (block 602), converting the syntax tree into an automaton (block 604), optimizing the automaton (block 606), converting the automaton into a netlist (block 608), placing the netlist on hardware (block 610), routing the netlist (block 612), and publishing the resulting image (block 614).

Figure 16:
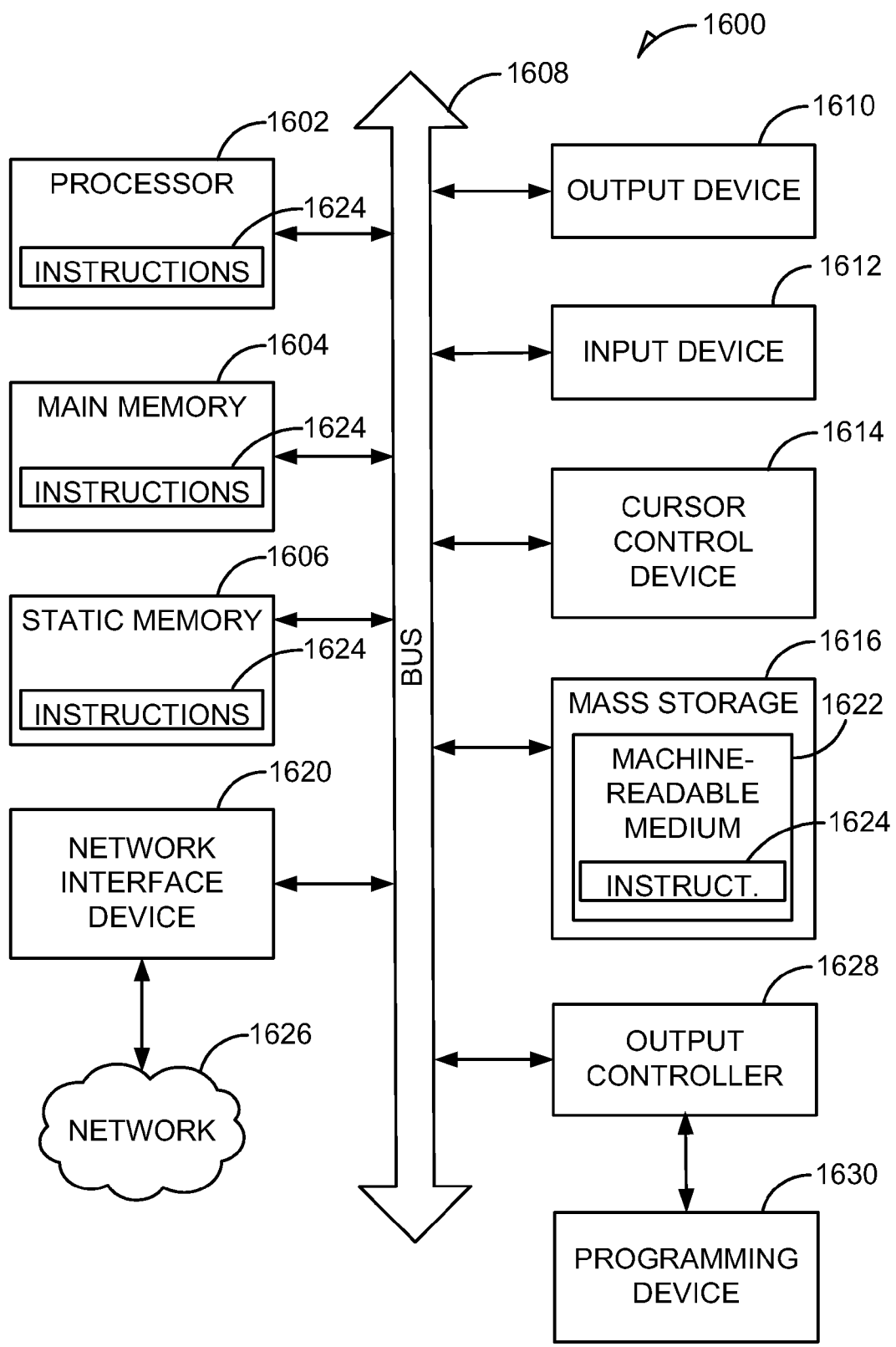
FIG. 16 illustrates an example of a computer having a Von Nuemann architecture, according to various embodiments of the invention.

In an example, the compiler includes an application programming interface (API) that allows software developers to create images for implementing FSMs on the FSM engine 600. The compiler provides methods to convert an input set of regular expressions in the source code into an image that is configured to program the FSM engine 600. The compiler can be implemented by instructions for a computer having a Von Nuemann architecture. These instructions can cause a processor on the computer to implement the functions of the compiler. For example, the instructions, when executed by the processor, can cause the processor to perform actions as described in blocks 602, 604, 606, 608, 610, 612, and 614 on source code that is accessible to the processor. An example computer having a Von Nuemann architecture is shown in FIG. 16 and described below.

In an example, the source code describes search strings for identifying patterns of symbols within a group of symbols. To describe the search strings, the source code can include a plurality of regular expressions (regexs). A regex can be a string for describing a symbol search pattern. Regexes are widely used in various computer domains, such as programming languages, text editors, network security, and others. In an example, the regular expressions supported by the compiler include search criteria for the search of unstructured data. Unstructured data can include data that is free form and has no indexing applied to words within the data. Words can include any combination of bytes, printable and non-printable, within the data. In an example, the compiler can support multiple different source code languages for implementing regexes including Perl, (e.g., Perl compatible regular expressions (PCRE)), PHP, Java, and .NET languages.

Referring back to FIG. 6, at block 602 the compiler can parse the source code to form an arrangement of relationally connected operators, where different types of operators correspond to different functions implemented by the source code (e.g., different functions implemented by regexes in the source code). Parsing source code can create a generic representation of the source code. In an example, the generic representation comprises an encoded representation of the regexs in the source code in the form of a tree graph known as a syntax tree. The examples described herein refer to the arrangement as a syntax tree (also known as an "abstract syntax tree") in other examples, however, a concrete syntax tree or other arrangement can be used.

Since, as mentioned above, the compiler can support multiple languages of source code, parsing converts the source code, regardless of the language, into a non-language specific representation, e.g., a syntax tree. Thus, further processing (blocks 604, 606, 608, 610) by the compiler can work from a common input structure regardless of the language of the source code.

As noted above, the syntax tree includes a plurality of operators that are relationally connected. A syntax tree can include multiple different types of operators. That is, different operators can correspond to different functions implemented by the regexes in the source code.

At block 604, the syntax tree is converted (e.g., transformed) into an automaton. In an example, the automaton comprises a software model of a FSM and can accordingly be classified as deterministic or non-deterministic. A deterministic automaton has a single path of execution at a given time, while a non-deterministic automaton has multiple concurrent paths of execution. An automaton includes a plurality of states that can be represented by nodes. In order to convert a syntax tree into an automaton, the operators and relationships between the operators in the syntax tree are converted into states (represented by nodes) with transitions (represented by directed edges) between the states in the automaton. In an example, the automaton can be converted based partly on the hardware of the FSM engine 200.

In an example, input symbols for the automaton include the symbols of the alphabet, the numerals 0-9, and other printable characters. In an example, the input symbols are represented by the byte values 0 through 255 inclusive. In an example, an automaton can be represented as a directed graph where the nodes of the graph correspond to the set of states. In an example, the data accepted (e.g., matched) by an automaton is the set of all possible character data which when input sequentially into the automaton will reach a final state. Each symbol in the data accepted by the automaton traces a path from the start state to one or more final states.

In an example, the automaton comprises general purpose states as well as special purpose states. The general purpose states and special purpose states correspond to general purpose elements and special purpose elements supported by a target device for which the compiler is generating machine code. Different types of target devices can support different types of general purpose elements as well as one or more different types of special purpose elements. A general purpose element can typically be used to implement a broad range of functions, while a special purpose element can typically be used to implement a more narrow range of functions. In an example, however, a special purpose element can achieve, for example, greater efficiency within its narrow range of function. Accordingly, a special purpose element can be used to, for example, reduce the machine cycles or the machine resources required to implement certain functions in the target device. In some examples, the target device supports solely special purpose elements, wherein multiple different types of special purpose elements are supported.

In an example where the compiler is generating machine code for the FSM engine 200, the general purpose states can correspond to SMEs 204, 205 and the general purpose states are accordingly referred to herein as "SME states". Moreover, when the compiler is generating machine code for the FSM engine 600, the special purpose states can correspond to counters 224 and are accordingly referred to herein as "counter states". In an example, the SME states in the automaton map 1:1 to SMEs (e.g., SME 204, 205) in the FSM engine 200 with the exception of the starting state of the automaton which does not map to a SME. The counters 224 may, or may not, map 1:1 to counter states.

In an example, special transition symbols outside the input symbol range may be used in the automaton. These special transition symbols can be used, for example, to enable use of special purpose elements 224. Moreover, special transition symbols can be used to provide transitions that occur on something other than an input symbol. For example, a special transition symbol may indicate that a first state is to be enabled (e.g., transitioned to) when both a second state and a third state are enabled. Accordingly, the first state is activated when both the second state and the third state are activated, and the transition to the first state is not directly dependent on an input symbol. Notably, a special transition symbol that indicates that a first state is to be enabled when both a second state and a third state are enabled can be used to represent a Boolean AND function performed, for example, by Boolean logic as the special purpose element 224. In an example, a special transition symbol can be used to indicate a counter state has reached zero, and thus transitions to a downstream state.

In an example, the automaton created from the syntax tree is a homogenous automaton. A homogeneous automaton is a restriction on the general automaton definition. The restriction requires that all transitions entering a state must occur on the same input symbol(s). The homogeneous automaton satisfies the following condition: For any two states, $q_1$ and $q_2$, if $r \in \delta(q_1) \cap \delta(q_2)$, denote $S_1 = \{a | a \in \Sigma, r \in \delta(q_1, a)\}$, $S_2 = \{a | a \in \Sigma, r \in \delta(q_2, a)\}$. $S_1$ is the set of symbols that allows $q_1$ to transition to r; and $S_2$ is the set of symbols that allows $q_2$ to transit to r. Here, $S_1 = S_2$, i.e. if state $q_1$ and state $q_2$ both transition to state r then the homogeneous restriction is that the transitions must occur on the same symbol(s).

For additional details on conversion of a syntax tree into the automaton, see discussion below in reference to FIG. 7.

At block 606, after the automaton is constructed, the automaton is optimized to, among other things, reduce its complexity and size. The automaton can be optimized by combining redundant states.

At block 608, the automaton is converted into a netlist. Converting the automaton into a netlist maps the states of the automaton to instances of a hardware element (e.g., SMEs 204, 205, GOT 210, special purpose element 224) of the FSM engine 200, and determines the connections between the instances. In an example, the netlist comprises a plurality of instances, each instance corresponding to (e.g., representing) a hardware element of the FSM engine 200. Each instance can have one or more connection points (also referred to herein as a "port") for connection to another instance. The netlist also comprises a plurality of connections between the ports of the instances which correspond to (e.g., represent) conductors to couple the hardware elements corresponding to the instances. In an example, the netlist comprises different types of instances corresponding to different types of hardware elements. For example, the netlist can include a general purpose instance corresponding to a general purpose hardware element and a special purpose instance corresponding to a special purpose hardware element. As an example, general purpose states can be converted into general purpose instances and special purpose states can be converted into special purpose instances. In an example, the general purpose instances can include an SME instance for an SME 204, 205 and a SME group instance for a hardware element comprising a group of SMEs. In an example, the SME group instance includes a GOT instance corresponding to a GOT 210; in other examples however, the SME group instance can correspond to a hardware element comprising a group of three or more SMEs. The special purpose instances can include a counter instance for a counter 224, and a logic instance for logic elements 224. Since a GOT 210 includes two SMEs 204, 205, a GOT instance contains two SME instances.

To create the netlist, states in the automaton are converted into instances in the netlist, except the starting state does not have a corresponding instance. SME states are converted into GOT instances and counter states are converted into counter instances. Additionally, a corresponding connection from a first instance to a second instance is created for a transition from a state corresponding to the first instance to a state corresponding to the second instance. Since the SMEs 204, 205 in the FSM engine 200 are grouped in pairs referred to as GOTs 210, the compiler can group SME states into pairs in a GOT instance. Due to physical design of a GOT 210, not all SME instances can be paired together to form a GOT 210. Accordingly, the compiler determines which SME states can be mapped together in a GOT 210, and then pairs the SME state into GOT instances based on the determination. Additional details on an example method of converting an automaton into a netlist are discussed below in reference to FIGS. 15A and 15B below.

At block 610, once the netlist has been generated, the netlist is placed to select a specific hardware element of the target device (e.g., SMEs 204, 205, other elements 224) for each hardware element instance of the netlist. According to an embodiment of the present invention, placing selects each specific hardware element based on general input and output constraints for the hardware elements.

Placement can be a difficult problem and is typically solved by using heuristics. It can be performed using methods such as force directed techniques, partitioning techniques, simulated annealing, or a combination of the above mentioned techniques.

In an example, two methods can be used to address the large combinatorial optimization problem; these are simulated annealing and multi-level hyper-graph partitioning. The trade-off between these methods is accuracy versus speed. Simulated annealing can produce a very high quality placement, but is extremely expensive on central processing unit (CPU) time. In contrast, hyper-graph partitioning can be orders of magnitude faster, but tends to produce less optimum placements. In an example, simulated annealing can be used to ensure a high quality placement that meets the needs of the target hardware device. In another example, hyper-graph partitioning can be used as a first stage followed by simulating annealing operation to refine the placement created by the hyper-graph partitioning stage. In some example, a combination of both simulated annealing and multi-level hyper graph partitioning is used in order to capitalize on the strengths of each heuristic.

At block 612, placed netlist is routed to determine the settings for the programmable switches (e.g., inter-block switches 203, intra-block switches 208, and intra-row switches 212) in order to couple the selected hardware elements together to achieve the connections describe by the netlist. In an example, the settings for the programmable switches are determined by determining specific conductors of the FSM engine 200 that will be used to connect the selected hardware elements, and the settings for the programmable switches. Routing can take into account more specific limitations of the connections between the hardware elements than placement at block 610. Accordingly, routing may adjust the location of some of the hardware elements as determined by the global placement in order to make appropriate connections given the actual limitations of the conductors on the FSM engine 200.

Once the netlist is placed and routed, the placed and routed netlist can be converted into a plurality of bits for programming of a FSM engine 200. The plurality of bits are referred to herein as an image.

In some examples, prior to converting the automaton into a netlist at block 608, the automaton is split into multiple smaller automatons and each smaller automaton is individually converted into a netlist at block 608. Since the complexity of placement at block 610 increases as the number of instances increases, splitting the automaton into a plurality of smaller automatons and converting the smaller automatons in individual netlists can provide smaller netlists for placing and routing at block 610 and block 612. Accordingly, placing the smaller netlists can help reduce the time required to determine an acceptable configuration. In an example, the automaton is split into multiple smaller automatons using graph theory. Each smaller automaton can then be individually converted into a netlist (block 608) and placed (block 610) within an assigned area. Accordingly, the available area can be divided up and assigned to different netlists with each netlist being individually placed within its assigned portion. As noted above, some portions of the available area may remain unassigned and thus are available for placement of other netlists. In an example, each netlist formed from a smaller automaton can have a configuration determined in parallel in order to reduce the overall processing time.

At block 614, an image is published by the compiler. The image comprises a plurality of bits for programming specific hardware elements and/or programmable switches of the FSM engine 200. In embodiments where the image comprises a plurality of bits (e.g., 0 and 1), the image can be referred to as a binary image. The bits can be loaded onto the FSM engine 200 to program the state of SMEs 204, 205, the special purpose elements 224, and the programmable switches such that the programmed FSM engine 200 implements a FSM having the functionality described by the source code. Placement (block 610) and routing (block 612) can map specific hardware elements at specific locations in the FSM engine 200 to specific states in the automaton. Accordingly, the bits in the image can program the specific hardware elements and/or programmable switches to implement the desired function(s). In an example, the image can be published by saving the machine code to a computer readable medium. In another example, the image can be published by displaying the image on a display device. In still another example, the image can be published by sending the image to another device, such as a programming device for loading the image onto the FSM engine 200. In yet another example, the image can be published by loading the image onto a parallel machine (e.g., the FSM engine 200).

In an example, an image can be loaded onto the FSM engine 200 by either directly loading the bit values from the image to the SMEs 204, 205 and other hardware elements 224 or by loading the image into one or more registers and then writing the bit values from the registers to the SMEs 204, 205 and other hardware elements 224. In an example, the hardware elements (e.g., SMEs 204, 205, other elements 224, programmable switches 203, 208, 212) of the FSM engine 200 are memory mapped such that a computer (e.g., a programming device coupled to or integral with the computer) can load the image onto the FSM engine 200 by writing the image to one or more memory addresses.

Figure 7:
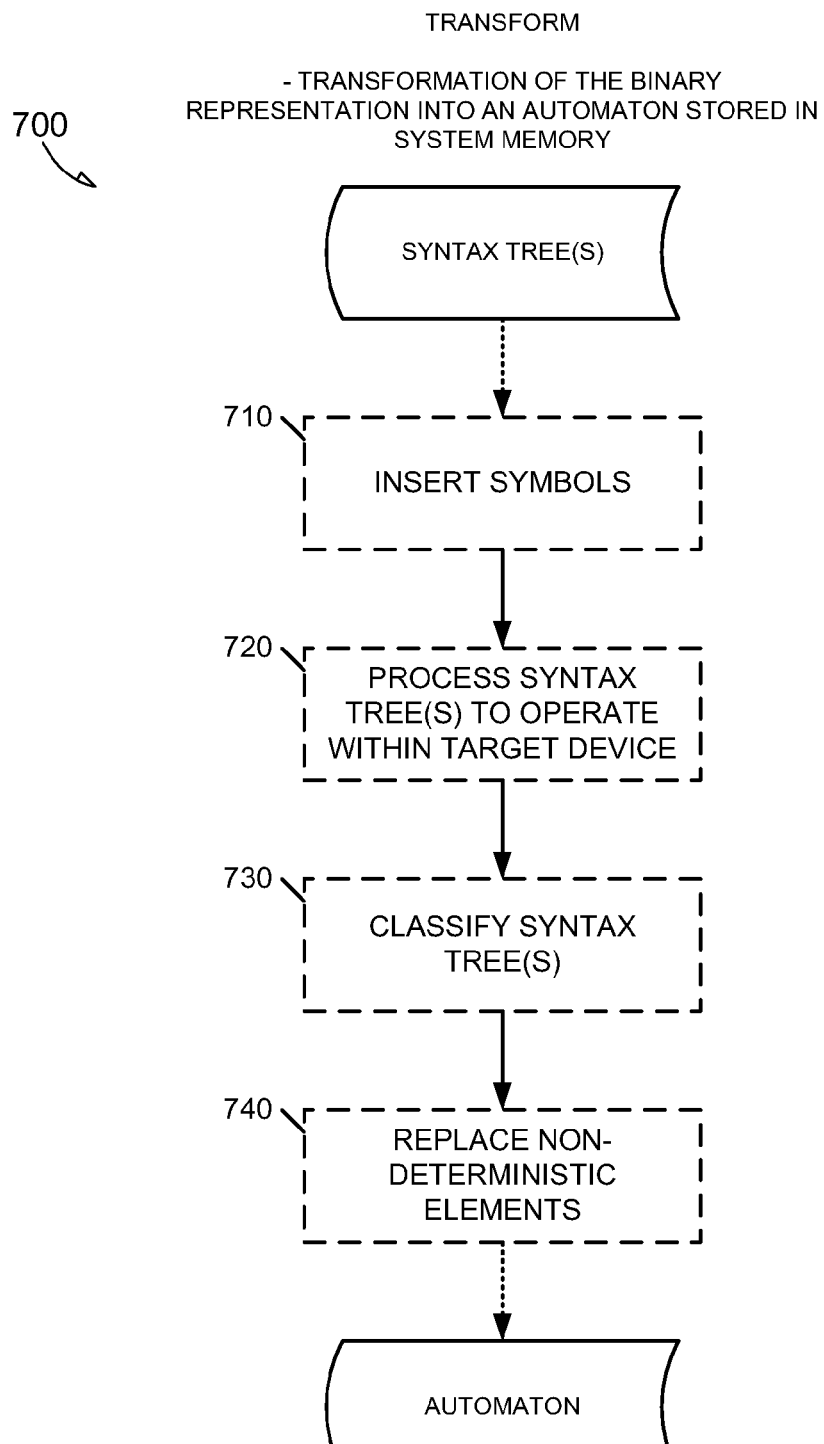
FIG. 7 illustrates various operations that can be included in an example method to convert a syntax tree into an automaton, according to various embodiments of the invention.
Figure 8:
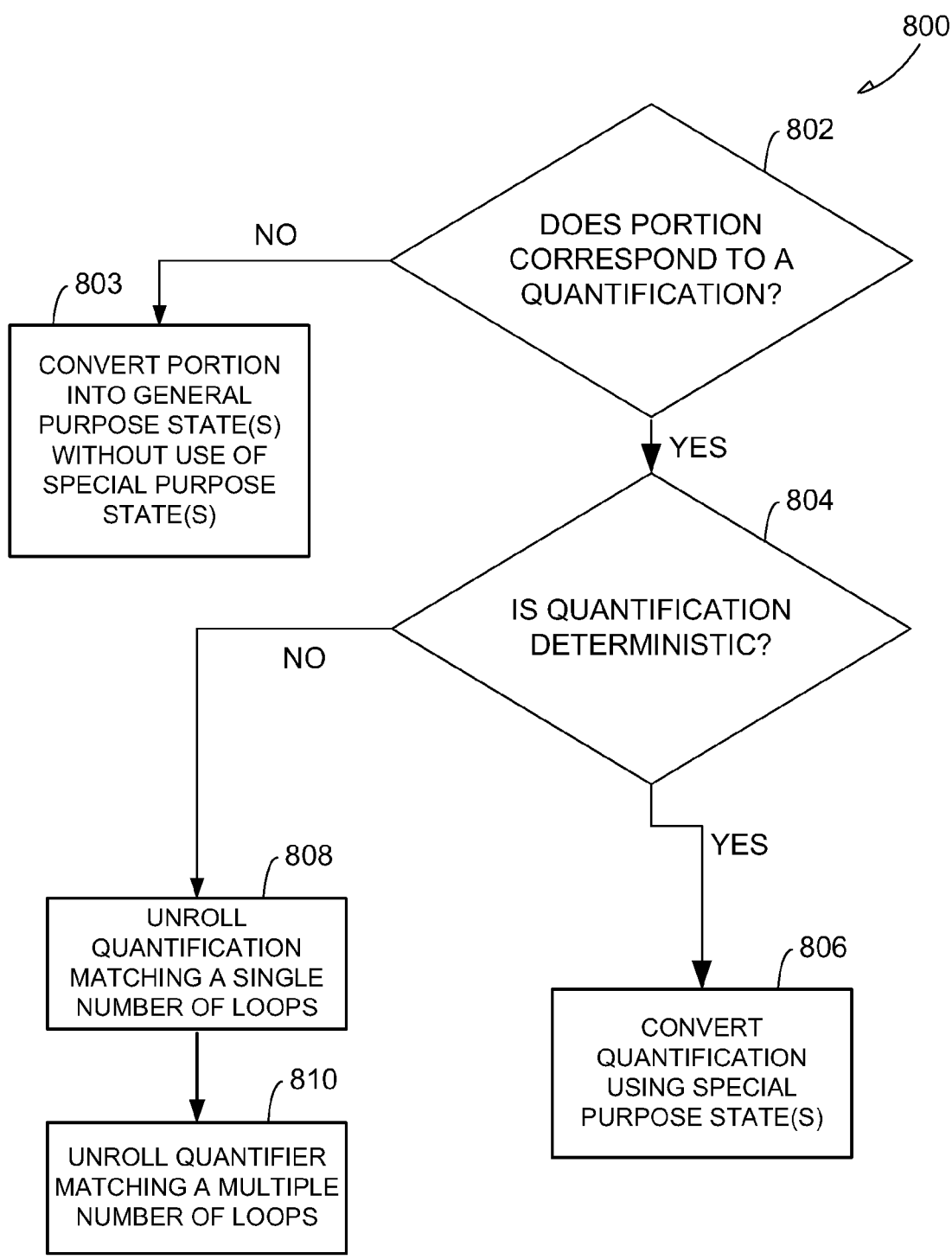
FIG. 8 illustrates a method for converting a syntax tree into an automaton according to various embodiments of the invention.

FIG. 7 illustrates various additional operations that can be included in an example method 604 for a compiler to convert a syntax tree into an automaton. The method 604 can include operations for inserting symbols (710), processing the syntax tree to operate within a target device (720), classifying syntax tree elements (730), and replacing non-deterministic operators (740). The method 604 depicted within FIG. 7 illustrates various operations that can be performed during conversion of one or more syntax trees into one or more automata. The order of the operations depicted within FIG. 7 is merely illustrative; the operations can be performed in various orders. Additionally, in certain examples, different combinations of the operations can be used.

In an example, the method 700 inserts special transition symbols into an automaton while converting the syntax tree into the automaton. In one such example, special transition symbols correspond to operators that do not map 1:1 to automaton states. As mentioned above, special transition symbols can be reserved for Boolean operations, Counters, and End-of-data functions, among others.

At 720, the method 700 can include an operation to adjust the syntax trees in view of constraints of a target hardware device. In an example, constraints of the target hardware device (e.g., the FSM engine 200) can impose limitations on the structure of an automaton. In situations where such constraints impose limitations, the complier can include operations at the conversion stage to adjust the states and/or transitions created within an automaton to conform to the hardware constraints.

At 730, the method 700 can include an operation to classify each syntax tree using a set of attributes. In an example, the operations can be classified using one of the standard techniques such as Glushkov's method.

At 740, the method 700 can include an operation to replace non-deterministic operators of a syntax tree with equivalent deterministic operators. In an example, certain types of non-deterministic operators, such as loops, can be implemented using a counter in conjunction with standard programmable elements. In an example, if the non-deterministic operator is not suitable for implementation with a special purpose hardware element, such as a counter, then the non-deterministic operator can be unrolled. Unrolling an operator can be accomplished by serializing all possible combinations of states corresponding to the non-deterministic operator.

Certain regular expressions when converted into an automaton can result in a large number of states. A large number of states can use a large number of the general purpose elements 102 to implement. To reduce the number of states, and thus the number of general purpose elements 102 used, special purpose hardware elements 112 can be used to implement certain regular expressions. For example, one regular expression that when converted to standard general purpose elements 102 can require a large amount of states is a quantification expression. A quantification expression corresponds to a looped structure that repeats one or more expressions a number of times. A quantification expression can be unrolled and implemented with a large number of general purpose states in series. In an example, however, special purpose hardware elements (e.g., other elements 112) such as a counter can be used to take advantage of the repeated expressions in a quantification expression to reduce the number of states used to implement the quantification expression.

Quantifications are well known in the art, and are used to describe repeated patterns. As an example, "A(B){n1, n2}C" is a general regular expression, where A, B and C are sub-expressions, and "(B){n1, n2}" comprises a quantification. As described herein, upper-case letters are used to represent regular expressions or a portion of a regular expression (e.g., a sub-expression). Double quotation marks may be added around regular expressions or sub-expressions to avoid confusion. Accordingly, an upper-case letter describing an expression can correspond to a search string for multiple input symbols. For example, the expression "A" can correspond to the input string 'abbc'.

Moreover, it should be understood that the terms expression and sub-expression are used herein for relational description only (e.g., a sub-expression is a portion of an expression), and that the terms expression and sub-expression should not be limited to any specific length, syntax, or number of characters. In particular, source code can include a large number of characters (including meta-characters and search characters) of which the entire set of characters or any individual portion thereof can be considered an "expression". For example, each of the following can be considered an expression "a(bb|d?){5, 20}c", "(b){0, 10}", "(b|d)", and "b".

A quantification is expressed in regex as "(B){n1, n2}", where B is a sub-expression, and n1 and n2 are integers specifying how many times the preceding sub-expression is allowed to occur. B is referred to herein as a repeated sub-expression since B is a sub-expression that is repeated the number of times specified by n1 and n2. To match the quantification "(B){n1, n2}", the repeated sub-expression B must be matched from n1 to n2 number of times. For example, the regex "(B){5, 7)" would require the sub-expression B to be matched 5, 6, or 7 times. In the regex "A(B){n1, n2}C", the sub-expression A is referred to herein as a drive expression, since the sub-expression A, when matched, transitions to a quantification. Additionally, to continue repeating and incrementing the count for the quantification, the repeated sub-expression(s) of the quantification must be matched consecutively. That is, when a repeated sub-expression is not matched during a given loop of the quantification, the quantification ends. In an example, the symbol '?' also corresponds to quantification, where the symbol preceding the '?' can be identified either one or zero times.

When the target device is the FSM engine 200, the method 800 can identify and map certain quantifications to the counters 224 on the FSM engine 200. Implementing certain quantifications with the counters 224 can result in efficiencies over implementing the quantifications with the state machine elements 204, 205. Accordingly, the automaton and the resulting image for the FSM engine 200 can be simplified. For example, portions of the syntax tree implementing quantifications can require a large amount of SMEs 204, 205 to implement. In an example, however, some of these quantifications can be implemented using a counter 224 with fewer states than would be required by SMEs 204, 205.

At block 802, the compiler identifies portions of the syntax tree that correspond to a quantification for possible implementation with the counters 224 in the FSM engine 200. If the portion of the syntax tree does not correspond to a quantification, the method 800 proceeds to block 803 where the portion is converted into general purpose states for implementation with SMEs 204, 205. If the portion of the syntax tree does correspond to a quantification, the quantification is further analyzed to determine whether the identified portion can be implemented with the counters 224.

Prior to making the determination of whether a quantification can be possibly implemented with a counter 224, if the language of pattern 'B' (i.e., all strings that 'B' matches), written as £(B), includes empty string, the quantification of "B{n1, n2}" is rewritten as "B'{0, n2}", where B' is the non-empty-string version of B, £(B')=£(B)–φ. For example, "(bc|){10, 20}" can be rewritten to "(bc){0, 20}", since these regexes accept the exact same data. Then, for a given quantification B{n1, n2}, the quantification can possibly be implemented with a counter (method proceeds to block 804) or alternatively implemented with SMEs and no counter (method proceeds to block 808) according to the following conditions:

1) When (n1=0, n2=–1), the quantification is to be unrolled with SMEs 204, 205 and no counter 224 (block 808). Here, no counter 224 is needed.
2) When (n1=1, n2=–1), the quantification is to be unrolled with SMEs 204, 205 and no counter 224 (block 808). Here, no counter 224 is needed.
3) When (n1>1, n2=–1), the quantification is to be split into two regexes B{n1–1} and B+, since B{n, –1} equals B{n1–1}B+. The quantification B{n1–1} can then possibly be implemented with a counter (block 804) while B+ is to be implemented with SMEs 204, 205 and no counter 224 (block 808). For B+ no counter 224 is needed.

4) When (n1=0, n2>0), the quantification is to be modified to (B{1, n2})? since (B{1, n2})? equals B{0, n2}. The non-nullable B{1, n2} can then possibly be implemented with a counter 224 (block 804).

5) When (n1>0, n2>0), the quantification can possibly be implemented as B{n1, n2} with a counter 224 (block 804).

In a summary, a quantification that can be possibly be implemented with a counter 224 (block 804) without modification can be written as B{n1, n2}, where B is not nullable, n1>0, n2>0, and n1<n2.

At block 804, once the compiler has identified a quantification that can possibly be implemented with a counter 224, the compiler determines whether a portion of the syntax tree corresponding to the identified portion is deterministic. When the identified portion is deterministic, the identified portion can be implemented with one or more counters 224, and the method 800 proceeds to blocks 806 and 807 where the identified portion is converted into one or more counter states along with one or more SME states. When the identified portion is not implemented using a counter 224, and the method 800 proceeds to block 808 where the identified portion is unrolled using one or more SME states as described below with respect to FIG. 13.

Generally, block 806 and blocks 808, 810 correspond to the two ways to convert a quantification into an automaton. At block 806, the quantification is converted using one or more counter states, possibly in conjunction with one or more SME states to implement the quantification as a loop. At blocks 808, 810, the quantification is converted by "unrolling" the quantification which includes using SME states and no counter states. Unrolling comprises rewriting the quantification with non-quantification syntax. For example, the regex "(b|c){1,2}" can be unrolled as "(b|c)(b|c)?". The merits of unrolling include (1) the resulted automaton is a directed acyclic graph (DAG) and can be easy to analyze and implement and (2) the resulting automaton can be implemented with general purpose elements, especially state machine elements, instead of special purpose elements. However, the number of general purpose states, and thus state machine elements, used to implement the unrolled quantification is linear to n1 and n2. Thus, the number of states may be large when n1 or n2 is a large number. In particular, real-life resources are limited, thus, in some examples this unrolling technique is used for only a limited category of quantifications. More detail regarding unrolling a quantification is provided below with respect to blocks 808, 810 and FIGS. 13A-C.

When the target device, however, has a special purpose element designed to implement a counting function, such as a counter 224, unrolling can be avoided in certain instances. The merit of this method is that fewer copies of a repeated expression are needed in the automaton, and the number of copies is independent of n1 and n2. Therefore, significant resources can be saved. For example, one or more counters 224 can be used to implement the quantification by creating a loop with the repeated expression(s) and the one or more counters 224. Each time the repeated expression(s) is matched, a counter 224 can be incremented (or decremented). The repeated expression(s) can then be re-activated to search for another match. When the counter 224 has be incremented (or decremented) equal to a number of times stated by the quantification, the counter 224 can activate the state(s) following the quantification. Accordingly, the quantification can be implemented with fewer SMEs 204, 205 since the SMEs used to implement the repeated expression(s) are re-used. However, due to the parallelism of the entire automaton (e.g., corresponding to the entire syntax tree), that is, multiple states that can be active at the same time, the counters 224, in some examples, can only be used with quantifications that correspond to deterministic portions of the entire automaton.

Figure 9:
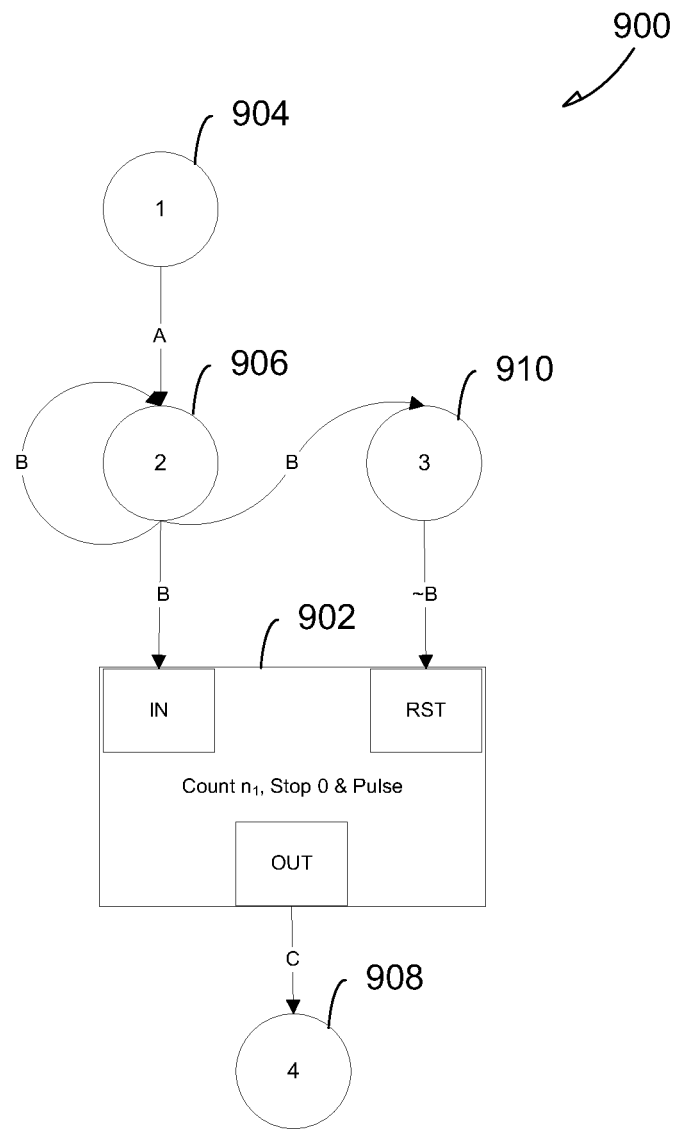
FIG. 9 illustrates an example automaton having a special purpose counter state, according to various embodiments of the invention.

FIG. 9 illustrates an example of a regex converted into an automaton 900 using a special purpose counter state 902 to implement a quantification. The automaton 900 corresponds to the regex "A(B){n1, n1}C" where both counting values (e.g., n1, n2) of the quantification are equal. Since both of the counting values are equal, a single counter 224 is used to implement the quantification. As shown in FIG. 9, the automaton 900 can be represented as a directed graph where the nodes of the graph correspond to a set of states.

The regex "A(B){n1, n1}C" is converted into a several SME states 904, 906, 910, 908, and a counter state 902. The SME states 904, 906, 908, 910 correspond to the sub-expressions "A", "B", and "C". The SME states 904, 906, 910, 908 can be implemented with SMEs 204, 205, while the counter state 902 can be implemented with a counter 224. When the automaton 910 is implemented on the FSM engine 200, a counter 224 corresponding to the counter state 902 is initially loaded with the value n1 and set to assert the zero-count output when the value in the counter 224 reaches zero. When n1 equals n2, the counter 224 can be set to Stop 0 and Pulse Output mode, which means that the counter 224 will assert its output once its value reaches zero, and the counter 224 will remain at zero and not issue any signal until the counter 224 is reset.

The automaton 900 begins at state 904 and transitions to state 906 upon matching the sub-expression "A". While at state 906, each time the sub-expression "B" is matched, the IN port of the counter state 902 is activated and the counter state 902 decrements by one. Additionally, each time the sub-expression "B" is matched state 906 activates itself as well as activating state 910. When the counter state 902 reaches zero, the output is activated and the automaton 900 will then search for the sub-expression "C". In the following cycle, two scenarios will occur: the first scenario occurs when "~B" is matched. When "~B" is matched the counter state 902 is reset and its value is set back to n1. Accordingly, the next time the sub-expression "A" is matched the process starts over from state 904. In the second scenario, the self loop of state 906 is still active and the IN port of the counter 902 continues to be triggered on a match of the sub-expression "B". Since the counter state 902 is configured in pulse mode, the counter state 902 will not activate its output again although the self-loop of state 906 remains active.

The negated version of the sub-expression "B is also referred to herein as "~B". In an example, the negated version of the sub-expression "B" is used to activate the reset port of the counter state 902. This is because since, "B" is the repeated expression of the quantification "(B){n1, n1}", when anything other than B (e.g., the negated version of "B") is received at the input (once state 906 has been activated), the quantification ends and the counter is accordingly reset. Accordingly, once state 910 is activated, the counter state 902 is reset and the quantification is not matched when the negated version of the sub-expression "B" is matched. In an example, the repeated expression(s) are negated using standard automaton theory.

Although a single counter state 224 is illustrated and described to implement a quantification when n1 equals n2, it should be recognized that multiple counters 224 can be cascaded as to account for numbers larger than supported by a single counter 224.

Figure 10:
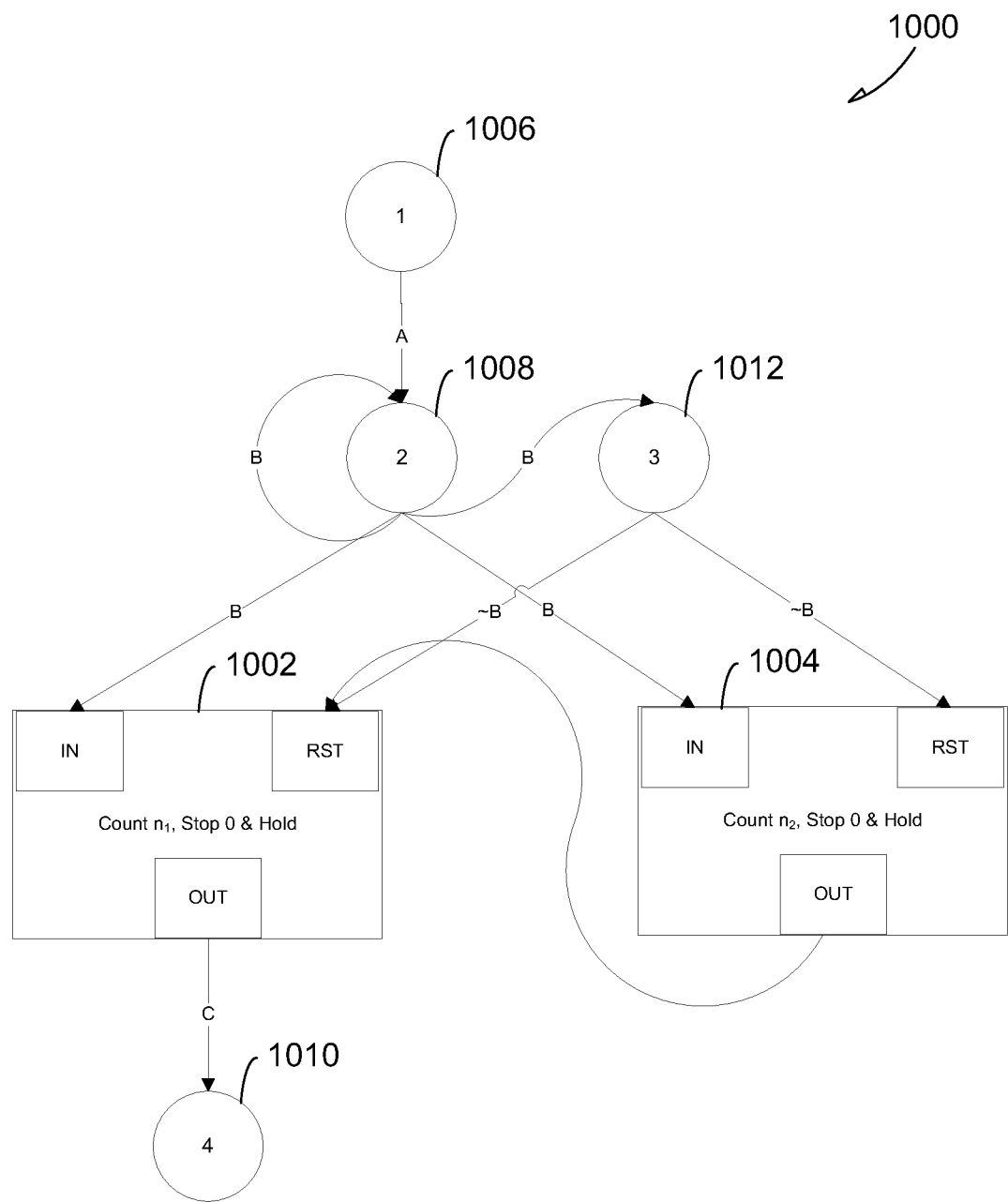
FIG. 10 illustrates another example automaton having a special purpose counter state, according to various embodiments of the invention.

FIG. 10 illustrates another example of a regex converted into an automaton 1000 using a plurality of special purpose counter states 1002, 1004 to implement a regex with a quantification. The automaton 1000 corresponds to the regex "A(B){n1, n2}C", where n1 is less than n2. Two counter states 1002, 1004 are used since n1 is less than n2 in the quantification "(B){n1, n2}". The counter states 1002, 1004 are configured to Stop 0 and Hold mode, which means that the counter states 1002, 1004 activate their output when the counter states 1002, 1004 reaches zero, and before the counter states 1002, 1004 are reset, the counter states 1002, 1004 remain at zero and keep activating their output each time the IN port is activated. In this example, the latency from counter state 1002 to counter state 1004 takes two cycles.

The counter state 1002 is initially set to n1, and the counter state 1004 is initially set to n2. The automaton transitions from state 1006 to state 1008 when the sub-expression "A" is matched. Once state 1008 is activated, the IN port of both counter state 1002 and counter state 1004 are activated each time that the sub-expression "B" is matched. Accordingly, both counter state 1002 and counter state 1004 are decremented by one. When counter state 1002 reaches zero, its output is activated and the automaton 1000 then searches for a match of the sub-expression "C" and activate state 1010. Once the sub-expression "B" has been matched n1 times, the value of the counter state 1004 is n2−n1. Later on, each time that the sub-expression "B" is matched, the IN port of counter state 1002 is activated and value of counter state 1002 remains at zero and its output is still activated. Meanwhile, the counter state 1004 continues to be decremented. When the sub-expression "B" is matched n2 times, the counter state 1004 also reaches zero and its output is activated which drives the reset port of counter state 1002. Since the counter state 1004 to counter state 1002 latency is two cycles, the counter state 1002 continues activating its output to state 1010. In the next cycle, the counter state 1002 is reset from the output of counter state 1004 and no output is asserted from the counter state 1002. In the following cycle, two scenarios will occur. In the first scenario, "~B" is matched. Both counter state 1002 and counter state 1004 are reset by state 1012 and their values are set to n1 and n2 respectively. Accordingly, the next time state 1006 is active and the next time the sub-expression "A" is matched, state 1008 is activated and the counter states 1002, 1004 being decrementing again. In the second scenario, the self loop of state 1008 remains activated and both counter states 1002, 1004 IN ports are activated. Since the counter state 1004 continually activates its output, the counter state 1002 is continually reset and does not activate its output as long as the self-loop of state 1008 is active.

In addition, a match of the sub-expression "B" while state 1008 is active, activates the state 1012. Once state 1012 is activated and "~B" is matched, the counter states 1002, 1004 are reset and the quantification is not matched. The negated version of the sub-expression "B" is used since "B" is the repeated expression of the quantification "(B){n1, n2}". Accordingly, the expression 'B' at state 1008 can be matched repeatedly for from n1 to n2 number of times. Although a single counter is illustrated and described to implement the lower (e.g., n1) and upper (e.g., n2) thresholds respectively, it should be recognized that multiple counters can be cascaded as known to those skilled in the art to count for numbers larger than supported by a single counter.

Prior to converting a quantification using a counter state, the compiler, at block 804, determines whether an automaton corresponding to the quantification is deterministic. In an example, the automaton is deterministic when the expression meets both the no-prefix the no re-entrance conditions discussed below. That is, in order for a quantification to be mapped to a counter 224, the quantification should meet the no-prefix and no re-entrance conditions as discussed below.

Referring to automaton 1000 of FIG. 10, the no re-entrance condition requires that the edge from state 1006 to state 1008 cannot be activated, while the counter state 1002 is active (e.g., while the counter state 1002 is counting). That is, it is determined whether the drive expression for the quantification can be matched while the quantification is already being processed. Matching a drive expression means that the states immediately prior to the quantification will transition to the states corresponding to the quantification. Accordingly, the quantification will be "re-entered" while a counter state is still processing a repeated expression. Since, in this example of the FSM engine 200, a counter 224 can only implement a single loop at any given time, transitioning to a quantification while a loop is already being processed can cause the counter 224 to count incorrectly during a given loop.

Figure 11A:
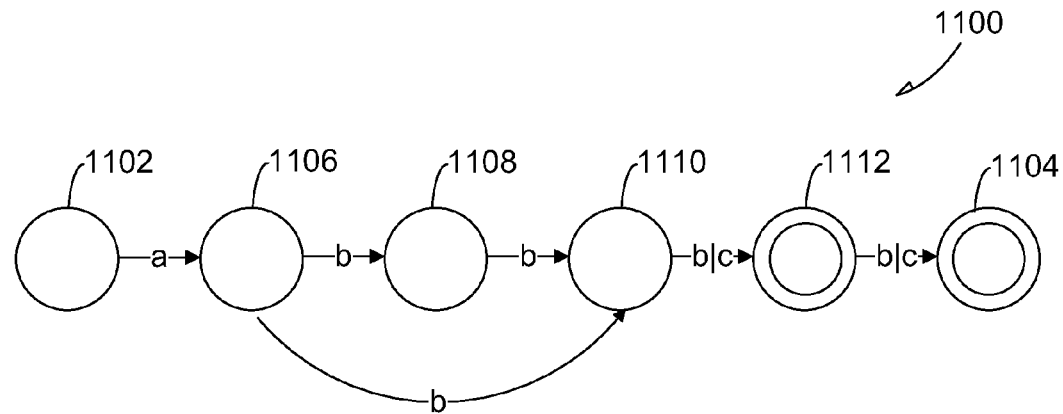
FIGS. 11A and 11B illustrate example automatons, according to various embodiments of the invention.
Figure 11B:
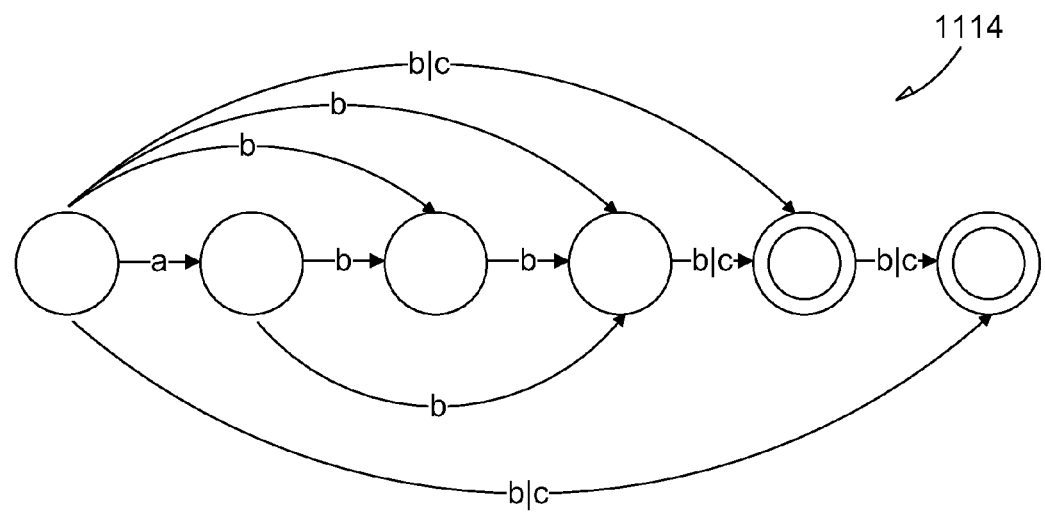

FIGS. 11A and 11B illustrate automatons 1100 and 1114 can be used to further explain the no re-entrance condition. FIG. 11A illustrates an example automaton 1100 corresponding to a quantification in a syntax tree in which the compiler can analyze to determine whether an automaton corresponding to the quantification is deterministic.

The automaton 1100 corresponds to the regular expression "abb?(b|c){1,2}" and includes a starting state 1102 and final states 1112, 1104. The final states are identified in FIG. 11A as double circles. The starting state 1102 is initially activated and transitions to state 1106 upon the input symbol 'a'. State 1106 transitions to both state 1108 and state 1110 on the input symbol 'b'. State 1108 transitions to state 1110 on the input symbol 'b', and state 1110 transitions to state 1112 on either the input symbol 'b' or 'c'. The automaton 1100 transitions from state 1112 to state 1104 on either the input symbol 'b' or 'c'.

The automaton 1100 comprises the automaton for the regex "abb?(b|c){1,2}", which is to be checked for compliance with the no re-entrance condition. The automaton 1114 comprises the automaton of the derived regex SS("abb?"," (b|c){2}") from the regex "abb?(b|c){1,2}" of automaton 1100. SS(M, N) is defined as a regex derived from M, N. The deriving steps include: 1) concatenate M and N, the result is denoted as "MN". 2) Construct the automaton for "MN", denoted as A(MN). 3) Modify A(MN) as following: a) Make the starting state of A(MN) drive all other states, and b) make all states corresponding to "N" as final states. Finally, 4) denote the regex for the modified automaton as SS(M, N). The accepted data of SS(M, N) is composed of the sub-strings that start from any state of "MN" and end at any state of N.

The no re-entrance condition can be defined as follows. Given a regular expression with a quantification "AB{n1, n2}C", the no re-entrance condition requires that £(SS(A, B{n1, n2})∩£(A)=Ø. In other words, once the sub-expression "A" is matched and the counter state 1002 begins to count, to meet the no re-entrance condition, the edge from state 1006 to state 1008 will not be activated again until "B{n1, n2}" is done (either match or fail). For example, "abb"∈£("abb?")∩£(SS("abb?", "(b|c){2}"), and thus "abb?(b|c){1, 2}" will not be correctly implemented with a counter 224.

Figure 12:
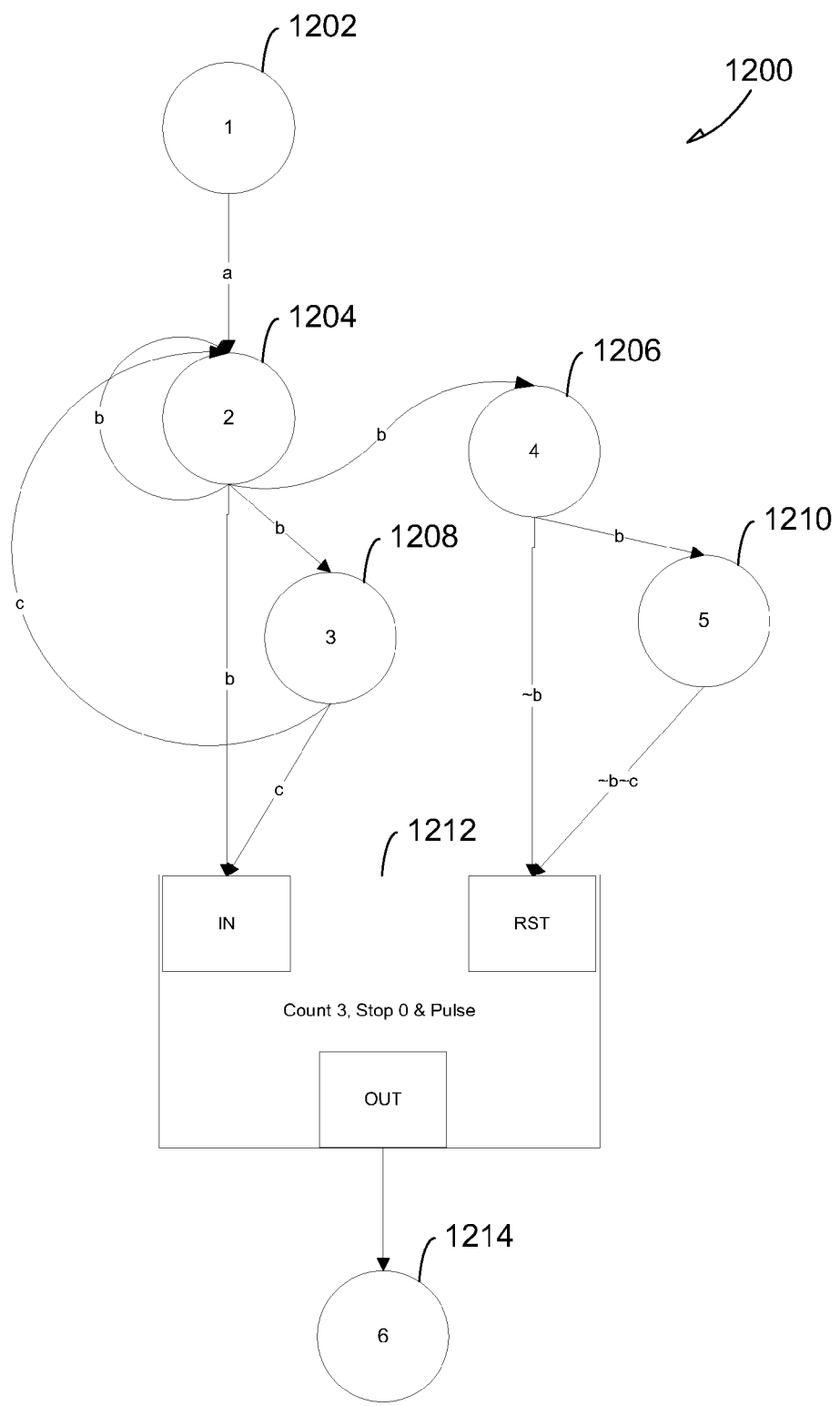
FIG. 12 illustrates an example automaton for a regex having a quantification that does not meet the no prefix condition, according to various embodiments of the invention.

Referring now to FIG. 12, the no prefix condition will be explained with reference to the automaton 1200. The no prefix condition states that any string of £(B) should not be the prefix of another string of £(B), which is to guarantee that B does not cause the counter(s) to count more than once. In other words, a quantification is not implemented as (and thus converted to) a counter 224 when a first repeated sub-expression of the quantification is a prefix of a second repeated sub-expression of the quantification. The formal statement is: For all $l_i$, $l_j \in £(B)$, $l_i \neq l_j$, we require $\{l_i, *\} \cap \{l_j, *\} = \emptyset$.

For example, the regex "a(b|bc){3}" does not meet the no prefix condition. Accordingly, the regex "a(b|bc){3}" would not be converted using a counter state and thus would not be implemented with a counter 224. Instead, the regex "a(b|bc){3}" would be converted into general purpose states without any counter states.

If the regex "a(b|bc){3}" were implemented with a counter 224, the input "abbc" would be falsely matched. For example, the automaton 1200 is the result of a hypothetical conversion of the regex "a(b|bc){3}" using a counter state 1212. As described below, this conversion results in incorrect performance of the counter state 1212. State 1202 is initially activated and at the input "a", state 1202 activates state 1204. With state 1204 activated, at the input "b", state 1204 activates states 1206, 1208, and re-activates itself, state 1204. Also, at the input "b", state 1204 activates the IN port of the counter 1212, where the initial value of the counter state 1212 is at 3 and is then reduced to 2. With the states 1204, 1206, and 1208 activated, the IN port of the counter state 1212 is activated by state 1204 again at another input "b" and the value in the counter state 1212 is reduced to 1. At this point, state 1204, 1206, and 1208 are activated. Then, an input value "c" causes the IN port of the counter state 1212 to be activated by state 1208 to reduce the value in the counter 1212 to 0. With the value in the counter 1212 at zero, the output is activated and state 1214 is activated indicating a match. This match, however, is a false positive since the input "abbc" has caused a match, when the sequence "abbc" does not meet the regex "a(b|bc){3}". Accordingly, the regex "a(b|bc){3}" does not meet the no prefix condition and should not be converted using a counter state and implemented with a counter 224.

If the quantification meets both the no prefix condition and the no re-entrance condition at block 804, then the quantification is converted using a special purpose counter state at block 806. The quantification can be converted as described with respect to FIGS. 10 and 11 above. If, however, the quantification does not meet either the no prefix or the no re-entrance condition, the quantification is converted at blocks 808, 810 by unrolling the quantification and converting to general purpose states and no counter state 224. The quantification is accordingly implemented with SMEs 204, 205 and not a counter 224.

Referring back to block 808, a quantification that can be matched with a single number of loops is unrolled to form an automaton having a plurality of the repeated sub-expressions linked serially. A quantification having a single number of loops corresponds to a quantification where n1 equals n2. The quantification "B{n1}", for example, can be unrolled as "BB . . . B", having n1 copies of B.

At block 810, a quantification that can be matched with a multiple number of loops is unrolled when n1 does not equal n2, and when n1 equals 1 and n2 is greater than 1. When n1 is greater than 1, the quantification is split into a first quantification that can be matched with n1−1 number of loops and a second quantification that can be matched with from one to n2−n1+1 numbers of loops. For example, the quantification B{n1, n2}, where n1>1, n2>1, and n1<n2 can be matched with multiple numbers of loops, in particular, from n1 to n2 numbers of loops. This quantification, B{n1, n2}, can be split into the following quantification B{n1−1}B{1, n2−n1+1}. The first quantification is the repeated sub-expression B that can be matched with a number of loops equal to n1−1. This first quantification is concatenated with a second quantification having the repeated sub-expression that can be matched by a number of loops from one to n2−n1+1. The first quantification B{n1−1} is unrolled as stated at 1302.

The second quantification B{1, n2−n1+1} can be unrolled based on the in-degree and/or out-degree of the resulting automaton. Unrolling a quantification can create states that have a large in-degree or a large out-degree. In an example, in-degree corresponds to the number of transitions to a state of the automaton, and out-degree corresponds to the number of transitions from a state of the automaton. Accordingly, the second quantification can be unrolled to control the transitions into (the in-degree) or out of (the out-degree) states when converting the second quantification into an automaton. For example, the quantification can be unrolled to limit the in-degree of each unrolled state to below a threshold number. Limiting the in-degree can be performed, for example, to take into account aspects and/or limitations of elements in the target device. Moreover, limiting the in-degree during unrolling can reduce the subsequent processing for the compiler.

In an example, when unrolling the quantification B{1, n2−n1+1} the automaton is generated as a trade-off between in-degree and out-degree. Accordingly, reducing the in-degree may increase the out-degree and reducing the out-degree may increase the in-degree. In an example, to unroll the loop structure of the quantification B{1, n2−n1+1}, a number of transitions are made either to or from the unrolled states to make the automaton accept any string of k concatentated B, where 1<=k<=n2−n1+1. Controlling whether the transitions are made to or from the unrolled states can be used to control the in-degree/out-degree for the automaton.

Although method 800 is described as corresponding to a single quantification, method 800 can be repeated for a plurality of quantifications within a syntax tree, and the resulting separate automatons can then be linked into a larger automaton.

Figure 13A:
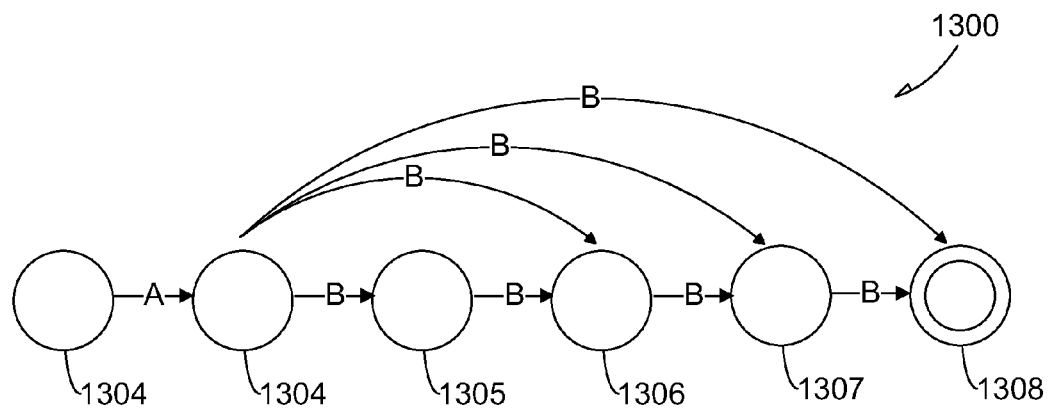
FIGS. 13A-13C illustrate example automatons for unrolled quantifications according to various embodiments of the invention.

FIG. 13A illustrates an example of an automaton 1300 where the expression AB{1, 4} is unrolled to minimize the in-degree. An automaton resulting from a quantification unrolled to minimize the in-degree is also referred to herein as a scatter pattern. The scatter pattern unrolled version of the expression AB{1, 4} corresponds directly to the expression A((((B?) B)?B)?B), to which the automaton 1300 corresponds. The automaton 1300 includes a drive state 1302 for the quantification B{1, 4} and a plurality of unrolled states 1304-1308, including a first state 1304 of the quantification and a last state 1308 of the quantification. In an example, each of the expressions A and B can correspond to multiple states for smaller automatons not shown. To minimize the in-degree of the automaton 1300, the transitions for the quantification are assigned as out-transitions from the first state 1304 to the other unrolled states 1305-1308. Accordingly, the first state 1304 has a large out-degree (4 out-transitions), and all the quantification states 1304-1308 have a small in-degree (1 or 2 in-transitions).

Figure 13B:
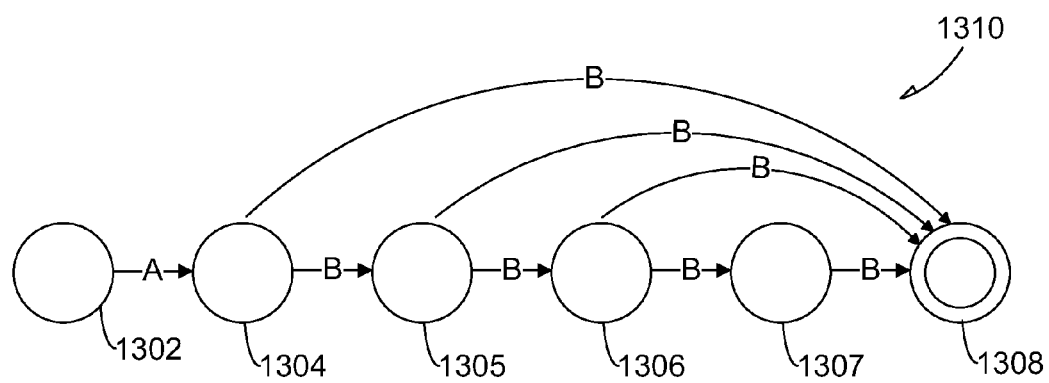

FIG. 13B illustrates an example of an automaton 1310 where the expression AB{1, 4} is unrolled to minimize the out-degree. An automaton resulting from a quantification unrolled to minimize the out-degree is also referred to herein as a merge pattern. The merge pattern unrolled version of the expression AB{1, 4} corresponds directly to the unrolled expression AB(B(B(B)?)?)?. The automaton 1308 includes the same states 1302, 1304-1308 as the automaton 1300 with different transitions between the states 1302, 1304-1308. To minimize the out-degree of the automaton 1310, the transitions for the quantification are assigned as in-transitions to the last state 1308 of the quantification. The in-transitions come from each of the unrolled states 1304-1307. Accordingly, all of the quantification states 1304-1308 have a small out-degree (1 or 2 out-transitions), but the last state 1308 of the quantification has a large in-degree (4 in-transitions).

In an example, an expression having a quantification is unrolled to limit one of the out-degree or the in-degree to less than a threshold. In an example, to unroll the expression AB{1, n1} to limit the in-degree to a threshold, a number of transitions for the quantification B{1, n1} up to the threshold can be assigned as in-transitions to the last state of the quantification B{1, n1}, and other transitions can be assigned as out-transitions for the first state of the quantification B{1, n1}. Conversely, to unroll an expression AB{1, n1} to limit the out-degree to a threshold, a number of transitions for the quantification B{1, n1} up to the threshold can be assigned as out-transitions to the first state for the quantification, and other transitions can be assigned as out-transitions for the last state of the quantification B{1, n1}.

Figure 13C:
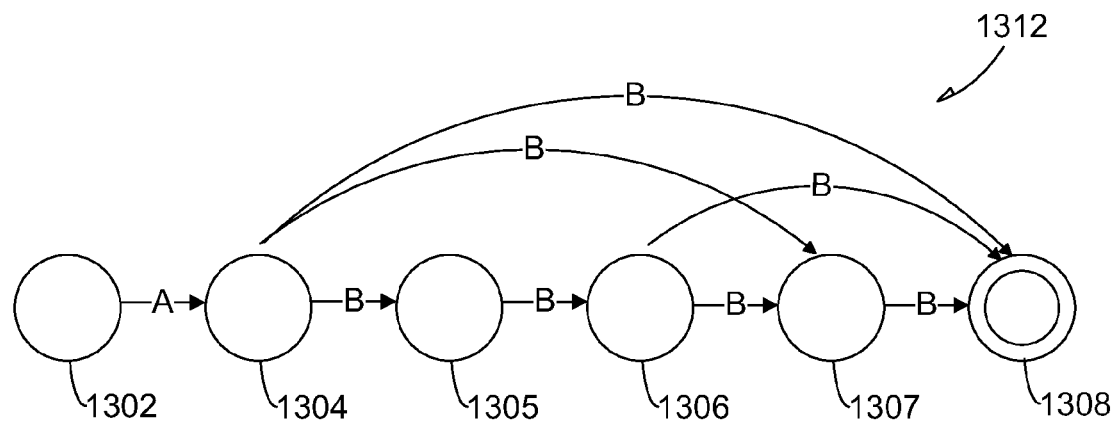

FIG. 13C illustrates another example of an automaton 1312 where the expression AB{1, 4} is unrolled to limit the in-transitions for any state to less than or equal to 3. The automaton 1312 includes the same states 1302, 1304-1308 as the automatons 1300 and 1308 with different transitions between the states 1302, 1304-1308. In an example, to limit the in-degree of the automaton 1312 to less than or equal to three (3) in-transitions, the transitions for the quantification are initially assigned as in-transitions to the last state 1308 of the quantification B{1, 4} until the limit of three has been reached, and other transitions are assigned as out-transitions from the quantification states 1304-1308. Thus, the last state 1308 as well as the other quantification states 1304-1307 of the quantification have an in-degree of equal to or below the limit of 3 and the first state 1304 has an out-degree of 3.

In other examples, the in-degree and out-degree of an expression can be set to be certain ratio (e.g., 1 to 1, 2 to 1) of each other. In yet other examples, the in-degree and out-degree of an expression can be set to be a certain ratio of each other up until a threshold is reached for either the in-transitions or out-transitions, and then another ratio can be used or all of the transitions can be assigned as in-transitions or out-transitions respectively.

A netlist is a connectivity instance, where instances correspond to hardware elements and directed edges are nets connecting the hardware elements. If a state drives another state, there would be an electrical connection between the SMEs to which these two states are assigned. Most physical devices have some limit on the number of connections between hardware components. To get a feasible mapping from an automaton to the physical device, the automaton has to be transformed such that in-degrees of all states meet the hardware connection limits.

As noted above, the compiler determines which SMEs can be grouped together based on the limitations of the FSM engine 200, if any. Accordingly, for the GOT 210, the compiler determines which SMEs can be paired together based on the output limitations for the SMEs 204, 205 in GOT 210.

In one such embodiment, the FSM engine 200 has limited connection for all hardware components. To get a feasible mapping from an automaton to the FSM engine 200, the automaton has to be transformed such that in-degrees of all states meet the connection limits.

In an example, therefore, the in-degree of an automaton can be limited based on hardware constraints of the target device. In an example, a two-level scheme can be used with FSM engine 200 to limit the drive-in of SMEs 204, 205. First, one can leverage the OR gates 230 provided by GOT 210, which will reduce the in-degree by at most 50% by pairing up outputs from SME states into a single output. The other component is Boolean, which can be configured to provide complex logical functions. In this example, we only consider it as a simple OR component. In the below algorithm, we estimate the usage of GOTs 210 in a conservative way. In the algorithm, when the estimated in-degree is greater than the constraints of the FSM engine 200, some states are split into multiple states, or a Boolean OR is inserted to reduce the in-degree as needed.

The basic idea of state splitting is to split a state into multiple states and distribute the drive-in of the pre-split state to the split states so that the in-degree of each split state meets the constraints. When the automaton is a directed acyclic graph (DAG), a simple breadth first traversal of the automaton can solve the problem. When loops (e.g., quantifications) exist, however, splitting may increase the number of states exponentially or may create a situation where no feasible solution is possible. Boolean logic can help reduce the increased states and thus alleviate this situation. In one embodiment, a Boolean OR, or its equivalent is used to handle loop conditions.

Figure 14A:
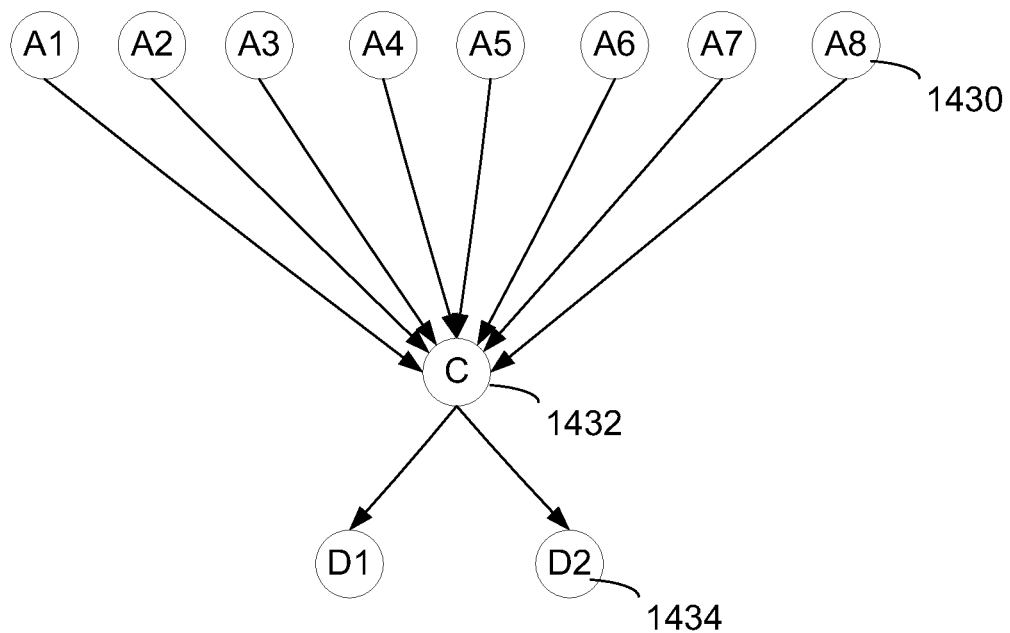
FIGS. 14A and 14B illustrate state splitting as part of limiting the in-degree of an automaton according to various embodiments of the invention.
Figure 14B:
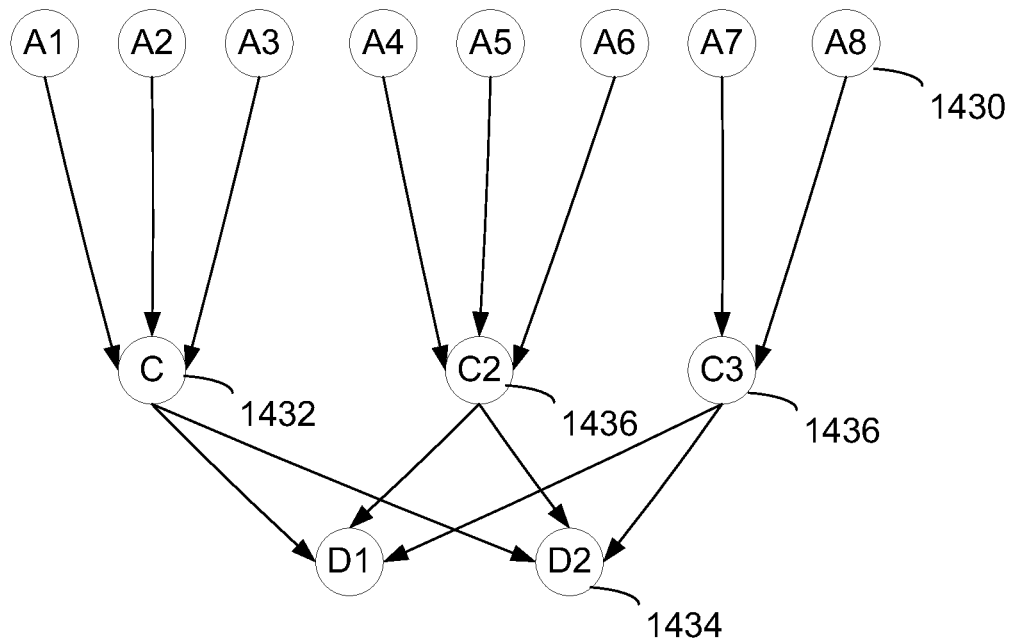

An example of splitting states is shown in FIGS. 14A and 14B. In the example shown in FIG. 9A, eight states 1430 feed one state 1432, which in turn feeds two states 1434. As shown in FIG. 9B, a state split as detailed above results in the addition of two new states 1436 (C2 and C3). Now, three states, however, feed the two states 1434.

Referring back to FIG. 5, a GOT 210 has output limitations on the SMEs 204, 205. In particular, the GOT 210 has a single output 218 shared by the two SMEs 204, 205. Accordingly, each SME 204, 205 in a GOT 210 cannot independently drive the output 218. This output limitation restricts which SMEs states can be paired together in a GOT instance. Notably, two SME states that drive (e.g., transition to, activate) different sets of external SME states (e.g., SME states corresponding to SMEs outside of the GOT instance) cannot be paired together in a GOT instance. This limitation, however, does not restrict whether the two SMEs states drive each other or self loop, since a GOT 210 can internally provide this functionality with the switches 240. Although the FSM engine 200 is described as having certain physical design corresponding to the SMEs 204, 205, in other examples, the SMEs 204, 205 may have other physical designs. For example, the SMEs 204, 205 may be grouped together into three or more sets of SMEs 204, 205. Additionally, in some examples, there may be limitations on the inputs 214, 216 to the SMEs 204, 205, with or without limitations on the outputs 226, 228 from the SMEs 204, 205.

In any case, however, the compiler determines which SME states can be grouped together based on the physical design of the FSM engine 200. Accordingly, for a GOT instance, the compiler determines which SME states can be paired together based on the output limitations for the SMEs 204, 205 in a GOT 210. In an example, there are five situations in which two SME states can be paired together to form a GOT 210 based on the physical design of the GOT 210.

The first situation when a first and a second SME state can be paired together in a GOT 210 occurs when neither the first or second SME state are final states, and when one of the first and second SME states does not drive any states other than the first or second SME states. As an example, a first state is considered to drive a second state when the first state transitions to the second state. When this first situation occurs, at most one of the first and second SME states is driving an external state(s). Accordingly, the first and second SME states can be paired together without being affected by the output limitations of the GOT 210. Due to the ability of the GOT 210 to couple the SMEs 204, 205 to one another internally, however, the first and second SME states are allowed to drive each other and self-loop to drive themselves. In automaton terms, the first SME state (corresponding to state q1) and the second SME state (corresponding to state q2) can be paired together when neither q1 nor q2 are final states, and δ(q1)−{q1, q2} is empty, or when δ(q2)−{q1, q2} is empty.

The second situation when a first and a second SME state can be paired together in a GOT 210 occurs when neither the first or second SME state are final states in the automaton, and when both the first and the second SME state drive the same external states. As used herein external states correspond to states outside of the GOT instance, for example, notwithstanding whether first and second SME states in a GOT instance drive each other or self loop. Here again, the output limitations of a GOT 210 do not affect the first and second SME states, since the first and second SME states drive the same external states. Also, due to ability of the GOT 210 to couple the SMEs 204, 205 to one another internally, the restriction on driving the same states does not include whether the first and second states drive each other or self-loop. Using automaton terms, the first SME state (corresponding to state q1) and the second SME state (corresponding to state q2) can be paired together when neither q1 nor q2 are final states, and δ(q1)−{q1, q2}=δ(q2)−{q1, q2}.

The third and fourth situations in which a first and a second SME state can be paired together in a GOT 210 occur when one of the first and second SME state are a final state and the other of the first and second SME state does not drive any external state. That is, the first SME state (corresponding to state q1) and the second SME state (corresponding to state q2) can be paired together when q1 is a final state and δ(q2)−{q1, q2} is empty, or when q2 corresponds to a final state and δ(q1)−{q1, q2} is empty. Since a final state outputs an indication of a match to a regex, a SME state corresponding to a final state should have independent use of the output 218 of the GOT 210 in order to indicate the match. Accordingly, the other SME state in the GOT 210 is not allowed to use the output 218.

The fifth situation when a first and a second SME state can be paired together in a GOT 210 occurs when both the first and second SME states correspond to final states in an automaton and both the first and the second SME states drive the same external states. Using automaton terms, the first state (corresponding to state q1) and the second SME state (corresponding to state q2) can be paired together when both q1 and q2 are final states, and δ(q1)−{q1, q2}=δ(q2)−{q1, q2}.

Once the compiler determines whether one or more SME states can be paired together, the compiler pairs the SMEs states into GOT instances. In an example, the compiler pairs SME states into GOT instances in the order they are determined to be capable of being paired to form a GOT instance. That is, once two particular SME states are determined to be capable of being paired together, these two SME states can be paired into a GOT instance. Once two SME states have been paired to form a GOT instance, these paired SME states are not available for pairing with other SME states. This process can continue until there are no longer any SME states left to be paired.

In an example, the compiler uses graph theory to determine which SMEs to pair together into a GOT instance. Since only certain SMEs can be paired together, some SME pairing can result in other SMEs having to be implemented in their own GOT instance with the other SME location in the GOT instance unused and hence wasted. Graph theory can be used to optimize SME utilization (e.g., reduce the number of unused SMEs) in the GOTs 210 by reducing the number of unused SME instances in the GOT instances of the netlist. To use graph theory, the compiler first determines all possible pairings between the SME states according to the physical design of the FSM engine 200 discussed above. The compiler then creates a graph where the vertices of the graph correspond to SME states and the edges of the graph correspond to possible pairings of the SME states. That is, if two SME states are determined to be capable of being paired together in a GOT instance, the two corresponding vertices are connected with an edge. Thus, the graph contains all the possible pairings of SME states.

The compiler can then find matching vertices for the graph to identify which SME states to pair together in a GOT 210. That is, the compiler identifies edges (and therefore pairs of vertices) such that no two edges between matching vertices of the graph share a common vertex. In an example, the compiler can find a maximal matching for the graph. In another example, the compiler can find a maximum matching for the graph. A maximum matching is a matching that contains the largest possible number of edges. There may be many maximum matchings. The problem of finding a maximum matching of a general graph can be solved in polynomial time.

Once all the matching vertices have been identified (e.g., as a maximum matching), each pair of SME states corresponding to matching vertices is mapped to a GOT instance. SME states corresponding to vertices that are un-matched are mapped to their own GOT instance. That is, SME states corresponding to vertices that are un-matched are mapped into one of SME location in GOT instance and the other SME location in the GOT instance is unused. Accordingly, given the netlist N and its corresponding set of matching vertices M, a number of GOT instances of N used equals |Q|−1−|M|, where Q is the set of states of the automaton, and "−1" is because in this example the starting state of the automaton does not correspond to an SME state.

In an example, the netlist N is constructed from the maximum matching M of G uses the least number of GOT instances. This can be proved by the following: if there exists another netlist N' that uses a lesser number of GOT instances, denote the corresponding matching as M'. Since the number of GOT instances of N' equals |Q|−1−|M'|, we have that |M|<|M'|. This conflicts with the fact that M is a maximum matching. Therefore, netlist N uses the least number of GOT instances.

Once the SME states are paired into GOT instances, the GOT instances, counter instances, and logic instances are connected according to the transitions between the states in the automaton. Since each GOT 210 has a single output, each GOT instance in the netlist has a single output port to connect to other instances. Accordingly, if either SME state in a first GOT instance drives an SME state in a second GOT instance, the output port of the first GOT instance is coupled to an input of the second GOT instance.

Figure 15A:
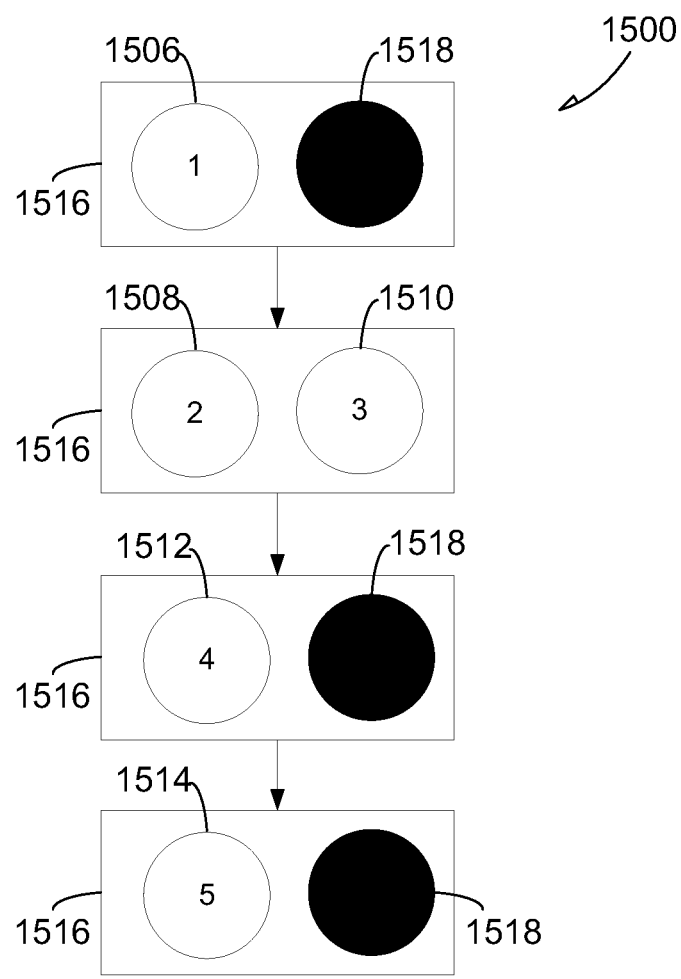
FIGS. 15A and 15B illustrate example netlists according to various embodiments of the invention.
Figure 15B:
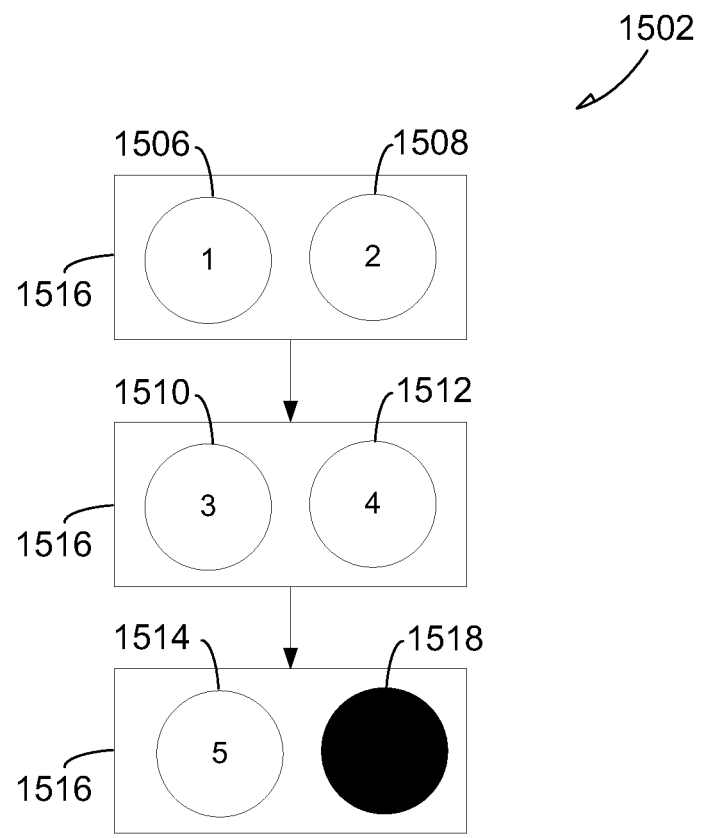

FIGS. 15A and 15B illustrate example netlists 1500, 1502 created from a homogeneous automaton. The netlists 1500, 1502 include SME instances 1506, 1508, 1510, 1512, and 1514. The netlist 1500 is an example of a non-optimal netlist. The netlist 1500 uses four GOT instances 1516 while leaving three SME instances 1518 unused. The netlist 1502, however, is an example of an optimal netlist created using graph theory to identify a maximum matching. The netlist 1502 uses three GOT instances 1516 and has a single unused SME instance 1518. In the netlist 1502, the instance 1510 can be connected to instance 1512 with connections internal to the GOT instance (e.g., via switch 240).

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

FIG. 16 illustrates generally an example of a computer 1600 having a Von Nuemann architecture. Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that can be employed to create one or more software programs designed to implement and perform the methods disclosed herein. The programs can be structured in an object-orientated format using an object-oriented language, such as Java, C++, or one or more other languages. Alternatively, the programs can be structured in a procedure-orientated format using a procedural language, such as assembly, C, etc. The software components can communicate using any of a number of mechanisms well known to those of ordinary skill in the art, such as application program interfaces or interprocess communication techniques, including remote procedure calls or others. The teachings of various embodiments are not limited to any particular programming language or environment.

Thus, other embodiments can be realized. For example, an article of manufacture, such as a computer, a memory system, a magnetic or optical disk, some other storage device, or any type of electronic device or system can include one or more processors 1602 coupled to a computer-readable medium 1622 such as a memory (e.g., removable storage media, as well as any memory including an electrical, optical, or electromagnetic conductor) having instructions 1624 stored thereon (e.g., computer program instructions), which when executed by the one or more processors 1602 result in performing any of the actions described with respect to the methods above.

The computer 1600 can take the form of a computer system having a processor 1602 coupled to a number of components directly, and/or using a bus 1608. Such components can include main memory 1604, static or non-volatile memory 1606, and mass storage 1616. Other components coupled to the processor 1602 can include an output device 1610, such as a video display, an input device 1612, such as a keyboard, and a cursor control device 1614, such as a mouse. A network interface device 1620 to couple the processor 1602 and other components to a network 1626 can also be coupled to the bus 1608. The instructions 1624 can further be transmitted or received over the network 1626 via the network interface device 1620 utilizing any one of a number of well-known transfer protocols (e.g., HTTP). Any of these elements coupled to the bus 1608 can be absent, present singly, or present in plural numbers, depending on the specific embodiment to be realized.

In an example, one or more of the processor 1602, the memories 1604, 1606, or the storage device 1616 can each include instructions 1624 that, when executed, can cause the computer 1600 to perform any one or more of the methods described herein. In alternative embodiments, the computer 1600 operates as a standalone device or can be connected (e.g., networked) to other devices. In a networked environment, the computer 1600 can operate in the capacity of a server or a client device in server-client network environment, or as a peer device in a peer-to-peer (or distributed) network environment. The computer 1600 can include a personal computer (PC), a tablet PC, a set-top box (STB), a Personal Digital Assistant (PDA), a cellular telephone, a web appliance, a network router, switch or bridge, or any device capable of executing a set of instructions (sequential or otherwise) that specify actions to be taken by that device. Further, while only a single computer 1600 is illustrated, the term "computer" shall also be taken to include any collection of devices that individually or jointly execute a set (or multiple sets) of instructions to perform any one or more of the methodologies discussed herein.

The computer 1600 can also include an output controller 1628 for communicating with peripheral devices using one or more communication protocols (e.g., universal serial bus (USB), IEEE 1394, etc.) The output controller 1628 can, for example, provide an image to a programming device 1630 that is communicatively coupled to the computer 1600. The programming device 1630 can be configured to program a parallel machine (e.g., parallel machine 100, FSM engine 200). In other examples, the programming device 1630 can be integrated with the computer 1600 and coupled to the bus 1608 or can communicate with the computer 1600 via the network interface device 1620 or another device.

While the computer-readable medium 1624 is shown as a single medium, the term "computer-readable medium" should be taken to include a single medium or multiple media (e.g., a centralized or distributed database, or associated caches and servers, and or a variety of storage media, such as the processor 1602 registers, memories 1604, 1606, and the storage device 1616) that store the one or more sets of instructions 1624. The term "computer-readable medium" shall also be taken to include any medium that is capable of storing, encoding or carrying a set of instructions for execution by the computer and that cause the computer to perform any one or more of the methodologies of the present invention, or that is capable of storing, encoding or carrying data structures utilized by or associated with such a set of instructions. The term "computer-readable medium" shall accordingly be taken to include, but be not limited to tangible media, such as solid-state memories, optical, and magnetic media.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

EXAMPLE EMBODIMENTS

Example 1 includes a computer including a memory having instructions stored thereon. The computer also includes a processor communicatively coupled to the memory, wherein the instructions, when executed by the processor, cause the processor to convert source code into an automaton comprising states and transitions between the states, wherein the states in the automaton include a special purpose state that corresponds to a special purpose hardware element. The instructions also cause the processor to convert the automaton into a netlist and place and route the netlist to provide machine code for configuring a target device.

Example 2 includes a computer-implemented method including parsing, using one or more processors, source code into a syntax tree. The method also includes converting, using the one or more processors, the syntax tree into an automaton, wherein the automaton defines a model of behavior having a plurality of states and transitions between the plurality of states, and wherein the automaton structure is dictated by a target hardware device. The method also includes converting, using the one or more processors, the automaton into a netlist, wherein the netlist includes a plurality of instances, each instance corresponding to a hardware element of a target device. The method also includes placing, using the one or more processors, each of the instances, wherein placing includes assigning each instance in the netlist to a hardware element of the target device. The method also includes routing, using the one or more processors, the connections between the hardware elements as a function of the netlist and creating programming data used to program the target device based on placing and routing.

Example 3 includes a programmable device including a plurality of programmable elements including one or more inputs and one or more outputs. The programmable device also includes an input block and an output block for interfacing a portion of the plurality of programmable elements to external circuits. The programmable device also includes a plurality of programmable switches communicatively connecting the plurality of programmable elements and the input block and the output block, wherein the setting of one or more programmable switches selectively controls signal routing between any two or more of the plurality of programmable elements and the plurality of programmable switches. The programmable device also includes a plurality of registers configured to store programmable data capable of configuring the plurality of programmable elements and the plurality of programmable switches, wherein the programming data is created by parsing, using one or more processors, source code into a syntax tree; converting, using the one or more processors, the syntax tree into an automaton, wherein the automaton defines a model of behavior having a plurality of states and transitions between the plurality of states, and wherein the automaton structure is dictated by a target hardware device; converting, using the one or more processors, the automaton into a netlist, wherein the netlist includes a plurality of instances, each instance corresponding to a hardware element of a target device; placing, using the one or more processors, each of the instances, wherein placing includes assigning each instance in the netlist to a hardware element of the target device; routing, using the one or more processors, the connections between the hardware elements as a function of the netlist; and creating programming data used to program the target device based on placing and routing.

Example 4 includes a computer-readable medium including instructions, which when implemented by one or more processors perform the following operations parse source code into a syntax tree; convert the syntax tree into an automaton, wherein the automaton defines a model of behavior having a plurality of states and transitions between the plurality of states, and wherein the automaton structure is dictated by a target hardware device; convert the automaton into a netlist, wherein the netlist includes a plurality of hardware elements associated with the target device, and wherein the netlist defines connections between the hardware elements; place each of the hardware elements, wherein placing includes assigning each hardware element in the netlist to a location within the target device; route the connections between the hardware elements as a function of the netlist; and create programming data used to program the target device to reflect placement and routing.

Example 5 includes a computer-implemented method including parsing, using one or more processors, source code into a syntax tree; converting, using the converting, using the one or more processors, the syntax tree into an automaton, wherein the converting includes restricting the automaton structure based on a target device, wherein the target hardware device includes state machine elements paired into groups of two. The method also includes converting, using the one or more processors, the automaton into a netlist, wherein the netlist includes a plurality of hardware elements associated with the target device, and wherein the netlist defines connections between the hardware elements; placing, using the one or more processors, each of the hardware elements, wherein placing includes assigning each hardware element in the netlist to a location within the target device; routing, using the one or more processors, the connections between the hardware elements as a function of the netlist; and creating a plurality of bits used to program the target device to reflect placement and routing.

In Example 6, the subject matter of any of Examples 1-5 can optionally include wherein convert source code includes converting the quantification into a plurality of states including the special purpose hardware state, when the quantification meets a condition to be mapped to a special purpose hardware element.

In Example 7, the subject matter of any of Examples 1-6 can optionally include wherein convert source code includes unrolling the quantification into a plurality of general purpose states when the quantification does not meet the condition to be mapped to a special purpose hardware element.

In Example 8, the subject matter of any of Examples 1-7 can optionally include wherein unrolling includes unrolling the quantification to control an in-degree of the automaton.

In Example 9, the subject matter of any of Examples 1-8 can optionally include optimizing the automaton, wherein optimizing includes splitting a particular state of the automaton into multiple states when an estimated in-degree of the particular state is greater than the constraint of the target device.

In Example 10, the subject matter of any of Examples 1-9 can optionally include wherein splitting the particular state comprises distributing driving states of the particular state to the multiple states so that an in-degree of each of the multiple states meets the constraint.

In Example 11, the subject matter of any of Examples 1-10 can optionally include wherein convert the automaton into the netlist includes mapping the states to instances of the netlist, wherein mapping includes mapping the special purpose state to a special purpose instance corresponding to a special purpose element.

In Example 12, the subject matter of any of Examples 1-11 can optionally include wherein convert the automaton into a netlist includes grouping states together based on a physical design of the target device.

In Example 13, the subject matter of any of Examples 1-12 can optionally include wherein the instances include a state machine element (SME) instance corresponding to a SME hardware elements and a SME group instance corresponding to a hardware element comprising a group of SMEs, and wherein grouping includes grouping states into a SME group instance.

In Example 14, the subject matter of any of Examples 1-13 can optionally include wherein converting the syntax tree into an automaton includes converting a quantification in the source code into a plurality of states including a special purpose state corresponding to a counter element of the target device.

In Example 15, the subject matter of any of Examples 1-14 can optionally include wherein a plurality of general purpose states corresponding to SMEs are grouped together to form a GOT instance based on an output limitation of a GOT hardware element.

In Example 16, the subject matter of any of Examples 1-15 can optionally include limiting the in-degree of the automaton, wherein limiting the in-degree includes limiting a number of transitions into a state of the automaton.

In Example 17, the subject matter of any of Examples 1-16 can optionally include wherein limiting the in-degree includes splitting a particular state into multiple states and distributing driving states of the particular state to the multiple states so that an in-degree of each of the multiple states meets a constraint.

In Example 18, the subject matter of any of Examples 1-17 can optionally include wherein limiting the in-degree includes unrolling a quantification into a plurality of unrolled states and limiting the number of in-transitions for any of the unrolled states.

In Example 19, the subject matter of any of Examples 1-18 can optionally include wherein converting includes determining whether a quantification in the source code meets a condition to be mapped to a counter of the target device; when the quantification meets the condition, converting the quantification into a plurality of states including a counter state; and when the quantification does not meet the condition, converting the quantification into a plurality of SME states by unrolling the quantification.

In Example 20, the subject matter of any of Examples 1-19 can optionally include wherein determining whether the quantification meets the condition includes determining whether a drive expression for the quantification can be matched while the quantification is being processed.

In Example 21, the subject matter of any of Examples 1-20 can optionally include wherein determining whether the quantification meets the condition includes determining whether a repeated expression of the quantification is a prefix of another repeated expression of the quantification.

In Example 22, the subject matter of any of Examples 1-21 can optionally include wherein converting the quantification into a plurality of states including a counter state includes implementing the plurality of states as a loop comprising a repeated expression of the quantification and the counter state, wherein the counter state is configured to count a number of times the repeated expression is matched, and wherein the counter state activates a downstream state when the repeated expression is matched a number of times specified by the quantification.

In Example 23, the subject matter of any of Examples 1-22 can optionally include wherein unrolling includes unrolling the quantification to control an in-degree of the automaton based on an in-degree constraint of the target device.

In Example 24, the subject matter of any of Examples 1-23 can optionally include wherein converting includes restricting the automaton structure based on the groups of two sharing a common output.

In Example 25, the subject matter of any of Examples 1-24 can optionally include wherein restricting includes restricting the automaton structure based on a counter element of the target device.

In Example 26, the subject matter of any of Examples 1-25 can optionally include publishing the plurality of bits.

In Example 27, the subject matter of any of Examples 1-26 can optionally include optimizing the automaton to reduce the plurality of states.

Example 28 includes a parallel machine programmed by an image produced using the subject matter of any of claims 1-27.

What is claimed is:

1. A machine-readable medium that is not a transitory propagating signal, the machine-readable medium including instructions that, when executed by a machine, cause the machine to perform operations comprising:
    obtaining an automaton created from source code, the automaton comprising states and transitions between the states;
    identifying a target device, the target device including hardware elements and connections between hardware elements;
    fitting the automaton to the target device by mapping the states of the automaton to hardware elements of the target device and identifying at least one of a conflict or an optimization between the automaton and the target device during the fitting;
    modifying the automaton to resolve the at least one of the conflict or the optimization to create a modified automaton; and
    mapping the modified automaton to the target device.

2. The machine-readable medium of claim 1, wherein identifying the optimization includes identifying a special purpose hardware element of the target device that performs multiple states of the automaton, and wherein modifying the automaton to resolve the optimization includes collapsing the multiple states into a single special purpose state corresponding to the special purpose hardware element.

3. The machine-readable medium of claim 1, wherein identifying the conflict includes identifying an in-degree limitation to a hardware element from the connections between hardware elements that is smaller than the in-degree of a state mapped to the hardware element, and wherein modifying the automaton to resolve the conflict includes dividing the state until the in-degree of each divided state is less than or equal to in-degree limitation.

4. The machine-readable medium of claim 1, wherein mapping the modified automaton to the target device includes:
    converting the automaton into a netlist, wherein the netlist includes a plurality of instances, each instance corresponding to a hardware element of a target hardware device;
    placing each of the instances including assigning each instance in the netlist to a hardware element of the target device; and
    routing the connections between the hardware elements as a function of the netlist.

5. The machine-readable medium of claim 4, comprising producing machine code for the target device from the routed and placed netlist.

6. The machine-readable medium of claim 4, wherein placing each of the instances includes grouping instances to match location constraints of corresponding hardware elements on the target device.

7. The machine-readable medium of claim 1, wherein the target device is a parallel machine, and wherein the hardware elements are machine elements.

8. A machine-implemented method comprising:
- obtaining an automaton created from source code, the automaton comprising states and transitions between the states;
- identifying a target device, the target device including hardware elements and connections between hardware elements;
- fitting the automaton to the target device by mapping the states of the automaton to hardware elements of the target device and identifying at least one of a conflict or an optimization between the automaton and the target device during the fitting;
- modifying the automaton to resolve the at least one of the conflict or the optimization to create a modified automaton; and
- mapping the modified automaton to the target device.

9. The method of claim 8, wherein identifying the optimization includes identifying a special purpose hardware element of the target device that performs multiple states of the automaton, and wherein modifying the automaton to resolve the optimization includes collapsing the multiple states into a single special purpose state corresponding to the special purpose hardware element.

10. The method of claim 8, wherein identifying the conflict includes identifying an in-degree limitation to a hardware element from the connections between hardware elements that is smaller than the in-degree of a state mapped to the hardware element, and wherein modifying the automaton to resolve the conflict includes dividing the state until the in-degree of each divided state is less than or equal to in-degree limitation.

11. The method of claim 8, wherein mapping the modified automaton to the target device includes:
- converting the automaton into a netlist, wherein the netlist includes a plurality of instances, each instance corresponding to a hardware element of a target hardware device;
- placing each of the instances including assigning each instance in the netlist to a hardware element of the target device; and
- routing the connections between the hardware elements as a function of the netlist.

12. The method of claim 11, comprising producing machine code for the target device from the routed and placed netlist.

13. The method of claim 11, wherein placing each of the instances includes grouping instances to match location constraints of corresponding hardware elements on the target device.

14. A computer comprising:
- a memory including instructions stored thereon; and
- a processor communicatively coupled to the memory when the computer is in operation, wherein the instructions, when executed by the processor, cause the processor to:
  - obtain an automaton created from source code, the automaton comprising states and transitions between the states;
  - identify a target device, the target device including hardware elements and connections between hardware elements;
  - fit the automaton to the target device by mapping the states of the automaton to hardware elements of the target device and identifying at least one of a conflict or an optimization between the automaton and the target device during the fitting;
  - modify the automaton to resolve the at least one of the conflict or the optimization to create a modified automaton; and
  - map the modified automaton to the target device.

15. The computer of claim 14, wherein to identify the optimization includes identifying a special purpose hardware element of the target device that performs multiple states of the automaton, and wherein to modify the automaton to resolve the optimization includes collapsing the multiple states into a single special purpose state corresponding to the special purpose hardware element.

16. The computer of claim 14, wherein to identify the conflict includes identifying an in-degree limitation to a hardware element from the connections between hardware elements that is smaller than the in-degree of a state mapped to the hardware element, and wherein to modify the automaton to resolve the conflict includes dividing the state until the in-degree of each divided state is less than or equal to in-degree limitation.

17. The computer of claim 14, wherein to map the modified automaton to the target device includes the processor to:
- convert the automaton into a netlist, wherein the netlist includes a plurality of instances, each instance corresponding to a hardware element of a target hardware device;
- place each of the instances including assigning each instance in the netlist to a hardware element of the target device; and
- route the connections between the hardware elements as a function of the netlist.

18. The computer of claim 17, comprising instructions that cause the processor to produce machine code for the target device from the routed and placed netlist.

19. The computer of claim 17, wherein to place each of the instances includes grouping instances to match location constraints of corresponding hardware elements on the target device.

20. The computer of claim 14, wherein the target device is a parallel machine, and wherein the hardware elements are machine elements.

* * * * *